US009864142B2

(12) United States Patent
Sakamoto et al.

(10) Patent No.: US 9,864,142 B2
(45) Date of Patent: Jan. 9, 2018

(54) LIGHT GUIDING DEVICE, MANUFACTURING METHOD, AND LD MODULE

(71) Applicant: FUJIKURA LTD., Tokyo (JP)

(72) Inventors: Shinichi Sakamoto, Sakura (JP); Shohei Kumeta, Tokyo (JP)

(73) Assignee: FUJIKURA LTD., Tokyo (JP)

( * ) Notice: Subject to any disclaimer, the term of this patent is extended or adjusted under 35 U.S.C. 154(b) by 0 days.

(21) Appl. No.: 15/273,266

(22) Filed: Sep. 22, 2016

(65) Prior Publication Data

US 2017/0010417 A1    Jan. 12, 2017

Related U.S. Application Data

(63) Continuation of application No. PCT/JP2015/057921, filed on Mar. 17, 2015.

(30) Foreign Application Priority Data

Mar. 26, 2014  (JP) ................................. 2014-064289

(51) Int. Cl.
*G02B 6/28* (2006.01)
*G02B 6/42* (2006.01)
(Continued)

(52) U.S. Cl.
CPC ............. *G02B 6/2817* (2013.01); *G02B 6/32* (2013.01); *G02B 6/34* (2013.01); *G02B 6/4206* (2013.01);
(Continued)

(58) Field of Classification Search
CPC .......... G02B 6/2817; G02B 6/32; G02B 6/34; G02B 6/4206; G02B 6/4226;
(Continued)

(56) References Cited

U.S. PATENT DOCUMENTS 4,978,197 A    12/1990  Horikawa
5,513,201 A *   4/1996  Yamaguchi ............ G02B 6/425
                                                              372/70
(Continued)

FOREIGN PATENT DOCUMENTS

CN    1164657 A    11/1997
CN    1521963 A     8/2004
(Continued)

OTHER PUBLICATIONS

Allowance for JP 2014-064289 (2 pages).
(Continued)

*Primary Examiner* — Peter Radkowski
(74) *Attorney, Agent, or Firm* — Westerman, Hattori, Daniels & Adrian, LLP

(57) ABSTRACT

A double mirror (Mi) of a light-guiding device of the present invention is made of (i) a first mirror (Mi1) that is mounted on a top surface of a base plate (B) and has a reflective surface (S1) entering an input beam reflected by the reflective surface (S1) and (ii) a second mirror (Mi2) that is mounted on a top surface of the first mirror (Mi1) and is a prism having a reflective surface (S2) reflecting the input beam that has been reflected by the reflective surface (S1), the input beam reflected by the reflective surface (S2) being totally reflected inside the prism.

18 Claims, 14 Drawing Sheets

(51) Int. Cl.

| | |
|---|---|
| *G02B 6/43* | (2006.01) |
| *H01S 5/022* | (2006.01) |
| *H01S 5/40* | (2006.01) |
| *G02B 6/32* | (2006.01) |
| *G02B 6/34* | (2006.01) |
| *H01S 5/00* | (2006.01) |
| *G02B 5/04* | (2006.01) |
| *F21V 8/00* | (2006.01) |
| *G02B 17/00* | (2006.01) |
| *G02B 19/00* | (2006.01) |
| *G02B 27/30* | (2006.01) |

(52) U.S. Cl.
CPC ......... *G02B 6/4226* (2013.01); *G02B 6/4239* (2013.01); *G02B 6/4244* (2013.01); *G02B 6/43* (2013.01); *H01S 5/0071* (2013.01); *H01S 5/02252* (2013.01); *H01S 5/4012* (2013.01); *G02B 5/04* (2013.01); *G02B 6/0031* (2013.01); *G02B 17/006* (2013.01); *G02B 19/0057* (2013.01); *G02B 27/30* (2013.01); *H01S 5/005* (2013.01); *H01S 5/0014* (2013.01); *H01S 5/02284* (2013.01); *H01S 5/4031* (2013.01)

(58) Field of Classification Search
CPC ...... G02B 6/4239; G02B 6/4244; G02B 6/43; G02B 6/0031; G02B 17/006; G02B 19/0057; G02B 27/30; H01S 5/0071; H01S 5/02252; H01S 5/4012; H01S 5/0014; H01S 5/005; H01S 5/02284; H01S 5/4031
See application file for complete search history.

(56) References Cited

U.S. PATENT DOCUMENTS

| | | | | |
|---|---|---|---|---|
| 5,629,791 | A | | 5/1997 | Harrigan |
| 5,808,323 | A | | 9/1998 | Spaeth et al. |
| 6,002,473 | A | * | 12/1999 | West ................. G01C 15/00 356/153 |
| 6,289,029 | B1 | * | 9/2001 | Goto ................. H01S 3/042 372/32 |
| 6,377,410 | B1 | * | 4/2002 | Wang ................. G02B 27/09 359/837 |
| 6,384,944 | B1 | * | 5/2002 | Takayama .......... H04B 10/1125 398/121 |
| 7,173,695 | B2 | * | 2/2007 | Katsunuma .............. G01J 3/02 356/326 |
| 8,351,033 | B2 | * | 1/2013 | Katsunuma ........ G02B 27/0018 356/327 |
| 2002/0008865 | A1 | * | 1/2002 | Shirai .................. G01C 15/00 356/4.04 |
| 2002/0051288 | A1 | * | 5/2002 | Shirai .................... G01C 1/02 359/431 |
| 2004/0218290 | A1 | * | 11/2004 | Ehrne .................. G02B 7/1805 359/831 |
| 2004/0252388 | A1 | * | 12/2004 | Yamanaka ......... G02B 27/0905 359/834 |
| 2004/0252744 | A1 | | 12/2004 | Anikitchev et al. |
| 2005/0088649 | A1 | * | 4/2005 | Katsunuma ............... G01J 3/02 356/328 |
| 2010/0141950 | A1 | * | 6/2010 | Katsunuma ........ G02B 27/0018 356/432 |
| 2011/0026270 | A1 | | 2/2011 | Onishi |
| 2013/0258469 | A1 | * | 10/2013 | Park ..................... G02B 27/283 359/485.01 |
| 2015/0219890 | A1 | * | 8/2015 | Kumeta ................ H01S 5/0071 359/226.1 |

FOREIGN PATENT DOCUMENTS

| | | | | |
|---|---|---|---|---|
| CN | 102401949 | A | | 4/2012 |
| JP | 60-91301 | A | | 5/1985 |
| JP | 60091301 | A | * | 5/1985 |
| JP | 01285806 | A | * | 11/1989 |
| JP | 06232508 | A | * | 8/1994 |
| JP | 06314832 | A | * | 11/1994 |
| JP | 07043643 | A | * | 2/1995 |
| JP | 7-98402 | A | | 4/1995 |
| JP | 07098402 | A | * | 4/1995 |
| JP | 07335693 | A | * | 12/1995 |
| JP | 08304611 | A | * | 11/1996 |
| JP | 2000036793 | A | * | 2/2000 |
| JP | 2000101515 | A | * | 4/2000 |
| JP | 2000162543 | A | * | 6/2000 |
| JP | 2001096384 | A | * | 4/2001 |
| JP | 2001-215443 | A | | 8/2001 |
| JP | 2001215443 | A | * | 8/2001 |
| JP | 2001350062 | A | * | 12/2001 |
| JP | 2002-107660 | A | | 4/2002 |
| JP | 2002107660 | A | * | 4/2002 |
| JP | 2004-252428 | A | | 9/2004 |
| JP | 2004252428 | A | * | 9/2004 |
| JP | 2004258624 | A | * | 9/2004 |
| JP | 2008-28109 | A | | 2/2008 |
| JP | 2008028109 | A | * | 2/2008 |
| WO | 01/82163 | A1 | | 11/2001 |
| WO | 2014/034428 | A1 | | 3/2014 |

OTHER PUBLICATIONS

JP Office Action for JP 2014-064289 (2 pages).
International Search Report dated Jun. 16, 2015, issued in counterpart International Application No. PCT/JP2015/057921 (2 pages).
Extended (supplementary) European Search Report dated Mar. 30, 2017, issued in counterpart European Patent Application No. 15769947.1. (4 pages).
Office Action dated Mar. 2, 2017, issued in counterpart Chinese Application No. 201580014791.6. (8 pages).
Chinese Office Action dated Aug. 9, 2017, issued in counterpart Chinese Patent Application No. 201580014791.6 with English translation.

* cited by examiner

LIGHT GUIDING DEVICE, MANUFACTURING METHOD, AND LD MODULE

This application is a Continuation of PCT International Application No. PCT/JP2015/057921 filed in Japan on Mar. 17, 2015, which claims the benefit of Patent Application No. 2014-064289 filed in Japan on Mar. 26, 2014, the entire contents of which are hereby incorporated by reference.

TECHNICAL FIELD

The present invention relates to a light-guiding device that converts an input beam bundle made of a plurality of input beams to an output beam bundle made of a plurality of output beams. The present invention also relates to a method of producing such a light-guiding device and to an LD module including such a light-guiding device.

BACKGROUND ART

LD modules are widely used for the purpose of coupling a laser beam emitted from a Laser Diode (LD) element (semiconductor laser element) to an optical fiber. Among such LD modules, a micro-optical device disclosed in Patent Literature 1 has been known as a light-guiding device that guides a laser beam emitted from each of a plurality of LD elements to an optical fiber.

FIG. 14 is a perspective view of a micro-optical device 10 disclosed in Patent Literature 1. As illustrated in FIG. 14, the micro-optical device 10 includes a base plate 11, an LD bar 12, a cylindrical lens 13, a first mirror row 14, and a second mirror row 15.

The LD bar 12 includes a plurality of LD elements aligned along an x axis and emits laser beams in a z-axis positive direction from the plurality of LD elements, respectively. The laser beams emitted in the z-axis positive direction from the plurality of LD elements, respectively, have respective optical axes that are aligned along the x axis within a first plane parallel to a zx plane.

Note that propagation directions of the laser beams emitted from the LD elements, respectively, are dispersed in directions in a range of ±θx around the z-axis positive direction at the center. On this account, the micro-optical device 10 is arranged such that the laser beams emitted from the LD elements, respectively, are collimated by the cylindrical lens 13 that is provided so as to face an emission edge surface of the LD bar 12 (i.e., the propagation directions are converged in the z-axis positive direction).

The first mirror row 14 is a mirror row in which mirror surfaces 14a are combined. The mirror surfaces 14a are opposed to the LD elements, respectively, which constitute the LD bar 12. Each of the laser beams emitted from the LD elements in the z-axis positive direction, respectively, is reflected into a y-axis positive direction by a corresponding mirror surface 14a which is opposed to a corresponding one of the LD elements. Meanwhile, the second mirror row 15 is a mirror row in which mirror surfaces 15a are combined. The mirror surfaces 15a are opposed to the mirror surfaces 14a, respectively, which constitute the first mirror row 14. Each of the laser beams having been reflected into the y-axis positive direction by the mirror surfaces 14a, respectively, is further reflected into an x-axis positive direction by a corresponding mirror surface 15a which is opposed to a corresponding one of the mirror surfaces 14a that has reflected the laser beam.

Note that, mirror surfaces 14a and 15a that reflect a laser beam emitted from an (i+1)th LD element (as counted in a direction from an x-axis positive side to an x-axis negative side) are provided on a z-axis negative direction side of mirror surfaces 14a and 15b that reflect a laser beam emitted from an i-th LD element (as counted in the direction from the x-axis positive side to the x-axis negative side). On this account, optical axes of the laser beams reflected into the x-axis positive direction by the mirror surfaces 15a are aligned along a z axis in a second plane that is parallel to the zx plane. This second plain is at a position on a y-axis positive direction side of the first plane as described above.

In this way, the micro-optical device 10 functions to convert a first beam bundle made of laser beams that (i) have been emitted from the LD elements constituting the LD bar 12 and (ii) propagate in the z-axis positive direction, to a second beam bundle made of laser beams that (i) have been reflected by the mirror surfaces 15a constituting the second mirror row 15 and (ii) propagate in an x-axis direction. The second beam bundle that is to be outputted from the micro-optical device 10 (hereinafter, referred to as "output beam bundle") is converged on an incident edge surface of an optical fiber by, for example, a lens (not illustrated).

CITATION LIST

Patent Literature

Patent Literature 1
Japanese Patent Application Publication, Tokukai, No. 2004-252428 (Publication Date: Sep. 9, 2004)

SUMMARY OF INVENTION

Technical Problem

However, in the conventional micro-optical device 10, it is inevitable that propagation directions of laser beams constituting an output beam bundle vary in a case where propagation directions of laser beams emitted from respective LD elements vary (the propagation directions are unevenly inclined). This is because the propagation directions of the laser beams constituting the output beam bundle cannot be individually adjusted due to a configuration in which the mirror surfaces 14a for reflecting the laser beams emitted from the LD elements are combined as the mirror row 14 and the mirror surfaces 15a for further reflecting the laser beams are combined as the mirror row 15. Variation of the propagation directions of the laser beams constituting the output beam bundle makes it difficult to converge the output beam bundle on an incident edge surface of an optical fiber, and consequently becomes a factor that hinders realization of a higher output and a higher efficiency.

This problem is particularly prominent in a multi-chip LD module. The multi-chip LD module indicates an LD module that has, as a light source, a plurality of LD chips each including one LD element. It is apparent that, in such a multi-chip LD module that requires mounting each LD chip individually, variation of propagation directions of laser beams emitted from respective LD chips easily occurs.

Note that in a case where inclinations of the propagation directions of the laser beams emitted from the LD elements, respectively, are uniform, it is possible to cause laser beams constituting the output beam bundle to propagate in a predetermined direction by adjusting an inclination of the mirror row 14. However, it is difficult to maintain such an inclination of the mirror row 14, for the following reason.

That is, it is difficult to maintain the inclination because a thickness of an adhesive layer interposed between the mirror row 14 and the base plate 11 needs to be made non-uniform in a case where the mirror row 14 in an inclined state is adhered to the base plate 11. Accordingly, when the adhesive layer is cured, non-uniform cure shrinkage occurs. This consequently changes the inclination of the mirror row 14. Further, even after the adhesive layer is cured, non-uniform thermal expansion/thermal shrinkage occurs in accordance with a temperature increase/temperature decrease. This consequently changes the inclination of the mirror row 14.

The present invention is attained in view of the above problems. An object of the present invention is to provide at a low cost (i) a light-guiding device that converts an input beam bundle made of a plurality of input beams to an output beam bundle made of a plurality of output beams, which light-guiding device is capable of adjusting propagation directions of the output beams into a predetermined direction even in a case where propagation directions of the input beams are inclined non-uniformly or uniformly, and also (ii) an LD module capable of realizing a higher output and a higher efficiency by use of the light-guiding device.

Solution to Problem

A light-guiding device in accordance with the present embodiment is a light-guiding device that converts an input beam bundle made of a plurality of input beams to an output beam bundle made of a plurality of output beams, including: double mirrors each corresponding to a corresponding one of the input beams, the double mirrors each being separated from the other double mirrors each corresponding to another one of the input beams, the double mirrors respectively corresponding to the input beams each being made of a first mirror that is mounted on a specific flat surface and a second mirror that is mounted on the first mirror, the first mirror having a first reflective surface reflecting a corresponding one of the input beams, the second mirror having a second reflective surface reflecting the corresponding one of the input beams that has been reflected by the first reflective surface, the second mirror being a prism, the corresponding one of the input beams reflected by the first reflective surface being reflected outside the first mirror, the corresponding one of the input beams reflected by the second reflective surface being totally reflected inside the prism.

In the above configuration, the first reflective surface for reflecting a corresponding one of the input beams is provided to the first mirror mounted on the specific flat surface. Further, the second reflective surface for reflecting the input beam reflected by the first reflective surface is provided to the second mirror mounted on the first mirror. Accordingly, a propagation direction of each of the output beams can be freely adjusted by rotating each of the first mirror and the second mirror. For example, even in a case where a propagation direction of an input beam is inclined, a propagation direction of a corresponding output beam can be adjusted into a predetermined direction. Furthermore, a position of an optical axis of each of the output beams can also be freely adjusted by sliding each of the first mirror and the second mirror.

Moreover, in the above configuration, the double mirrors each correspond to a corresponding one of the input beams. Further, each of these double mirrors is separated from the other double mirrors each corresponding to another one of the input beams. Accordingly, a propagation direction of each of the output beams can be adjusted independently from propagation directions of the other output beams. This makes it possible to adjust the propagation directions of the output beams into a predetermined direction even in a case where the propagation directions of the input beams vary. In addition, it also becomes possible to adjust a position of an optical axis of each of the output beams independently from positions of optical axes of the other output beams.

In the above configuration, the second mirror is a prism. This allows the second mirror to have a smaller shape tolerance and makes it possible to produce the second mirror at a low cost. Further, in the above configuration, the corresponding one of the input beams reflected by the second reflective surface is totally reflected inside the prism. This eliminates the need to apply high reflective coating to a surface of the second mirror. Also from this viewpoint, the second mirror can be produced at a low cost.

Advantageous Effects of Invention

The present invention makes it possible to provide at a low cost (i) a light-guiding device capable of adjusting propagation directions of output beams into a predetermined direction even in a case where propagation directions of the input beams are inclined non-uniformly or uniformly, and also (ii) an LD module capable of realizing a higher output and a higher efficiency by use of the light-guiding device.

Figure 5:
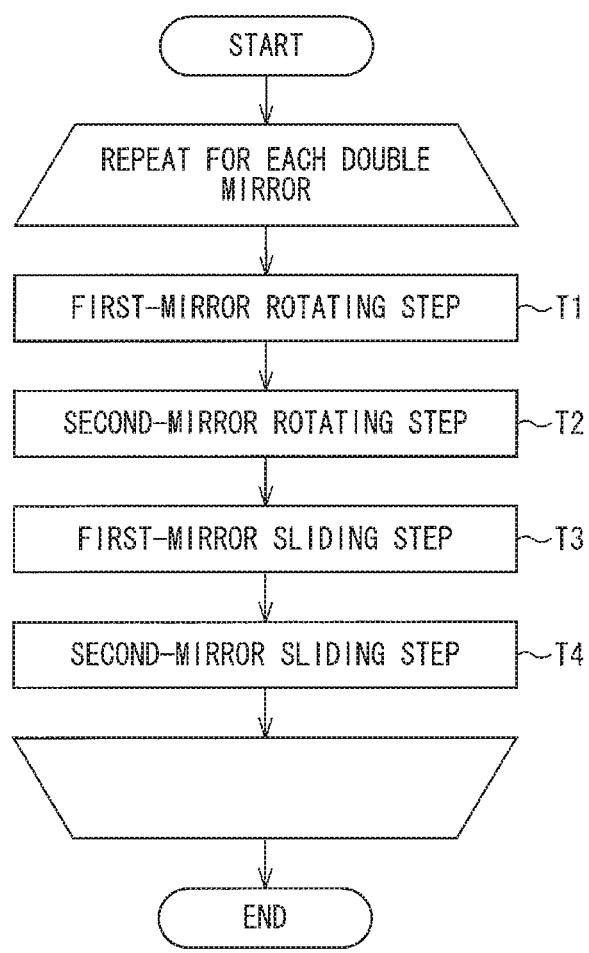
FIG. 5 is a flow chart illustrating a method of adjusting orientations and positions of the first mirror and the second mirror provided in the double mirror illustrated in FIG. 3.
Figure 6:
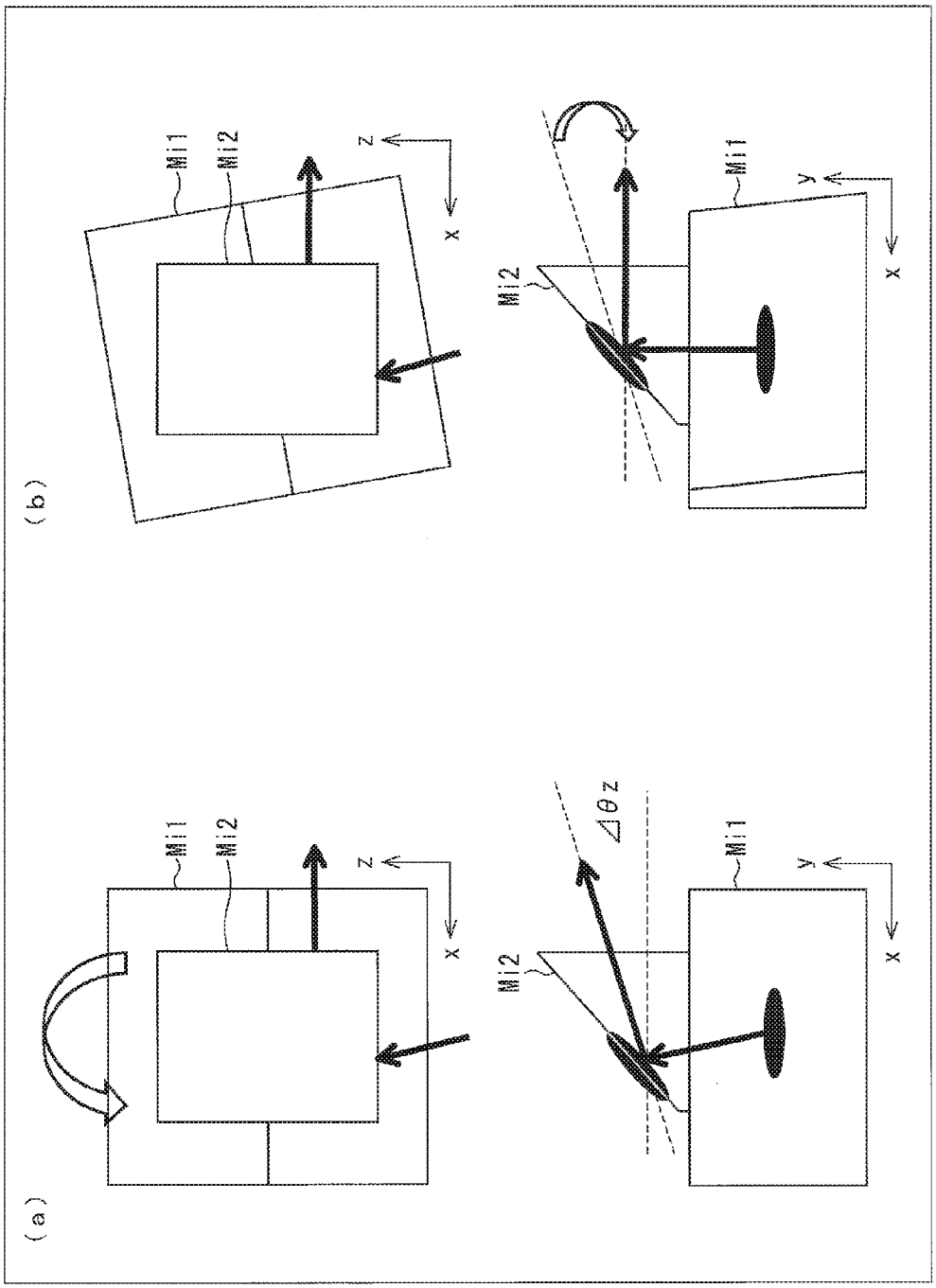

(a) of FIG. 6 is a top view (upper part) and a front view (lower part) each illustrating, as an example, a state of the double mirror prior to a first-mirror rotating step in the flow chart of FIG. 5. (b) of FIG. 6 is a top view (upper part) and a front view (lower part) each illustrating, as an example, a state of the double mirror after the first-mirror rotating step.

Figure 7:
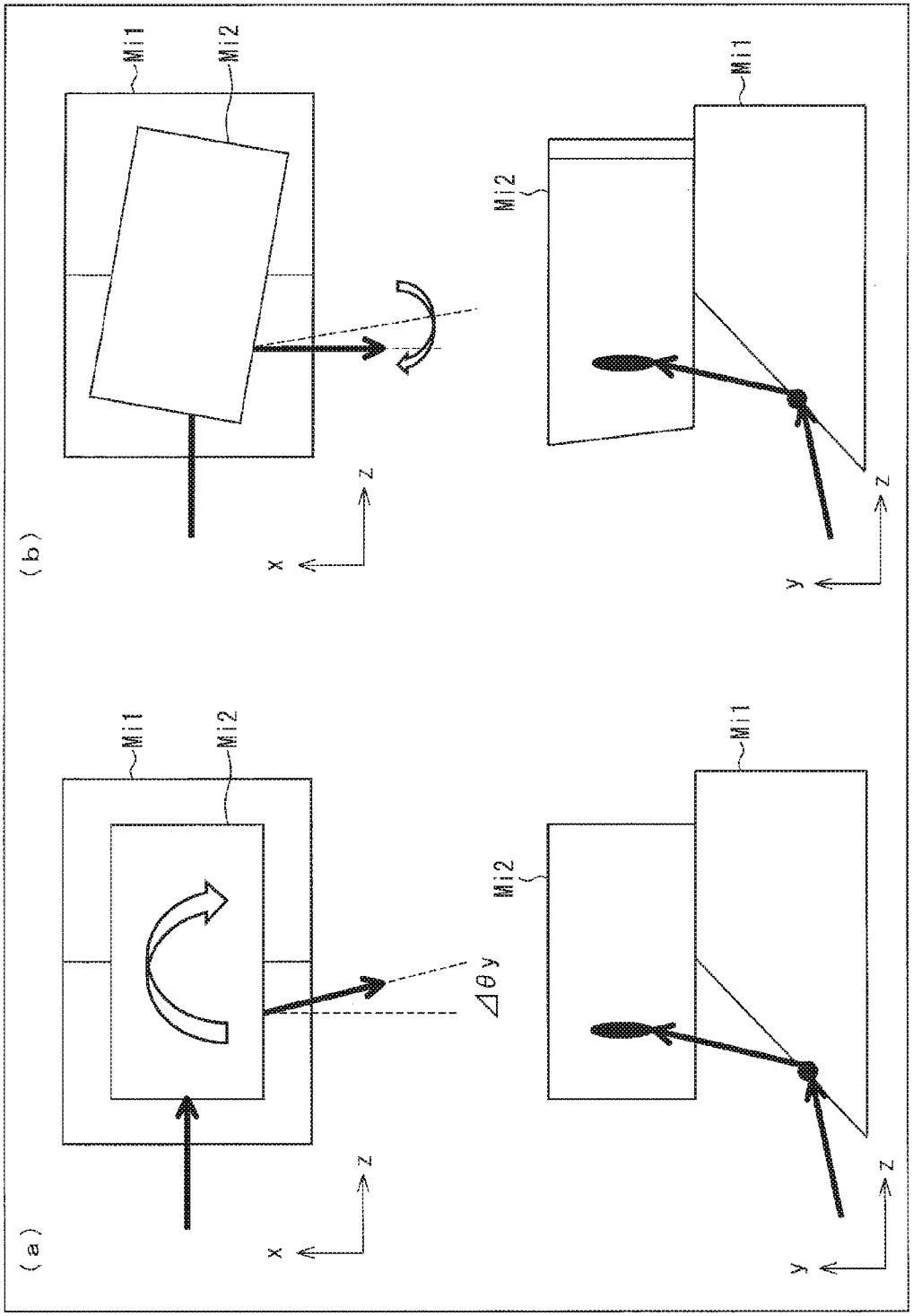

(a) of FIG. 7 is a top view (upper part) and a side view (lower part) each illustrating, as an example, a state of the double mirror prior to a second-mirror rotating step in the flow chart of FIG. 5. (b) of FIG. 7 is a top view (upper part) and a side view (lower part) each illustrating, as an example, a state of the double mirror after the second-mirror rotating step.

Figure 8:
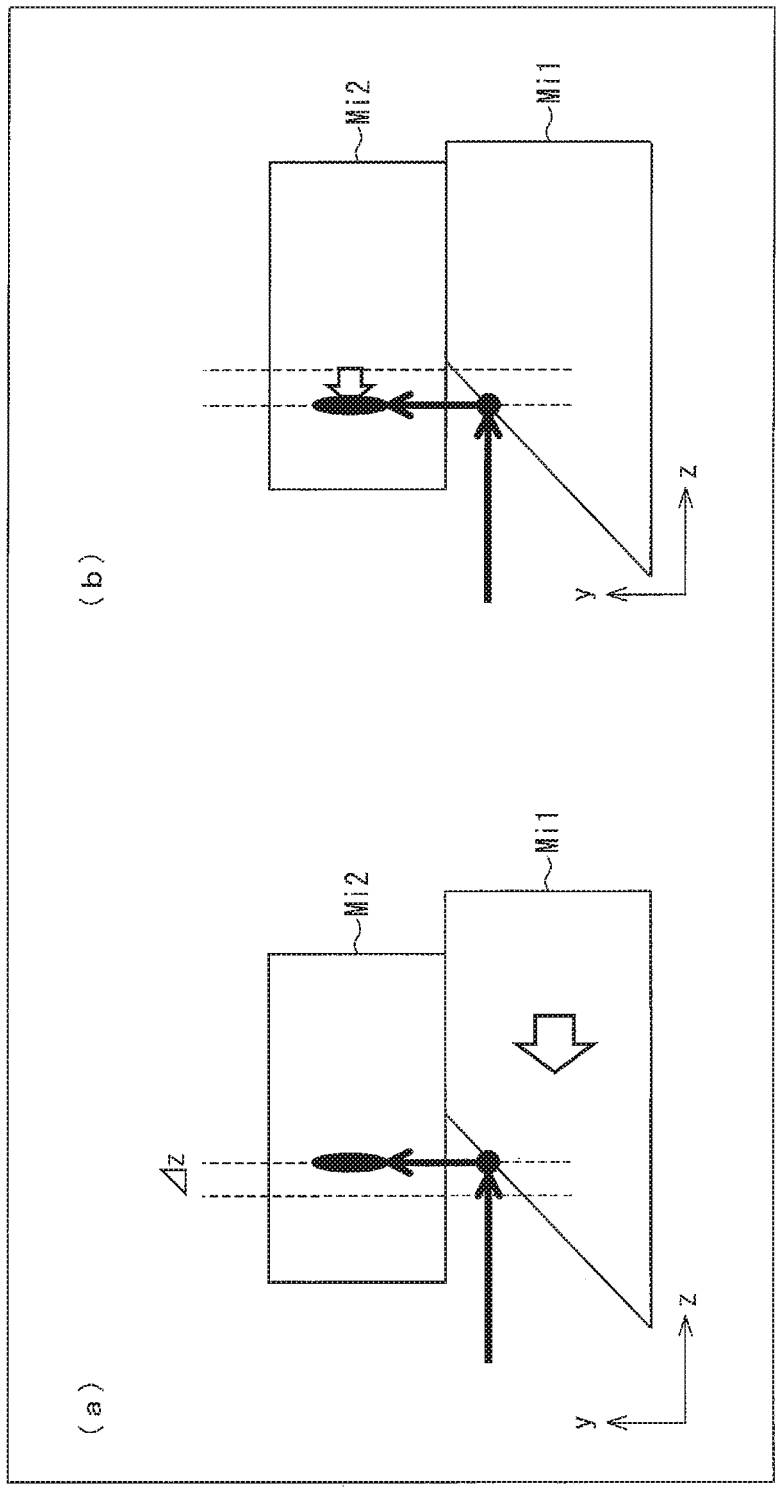

(a) of FIG. 8 is a side view illustrating, as an example, a state of the double mirror prior to a first-mirror sliding step in the flow chart shown in FIG. 5. (b) of FIG. 8 is a side view illustrating, as an example, a state of the double mirror after the first-mirror sliding step.

Figure 9:
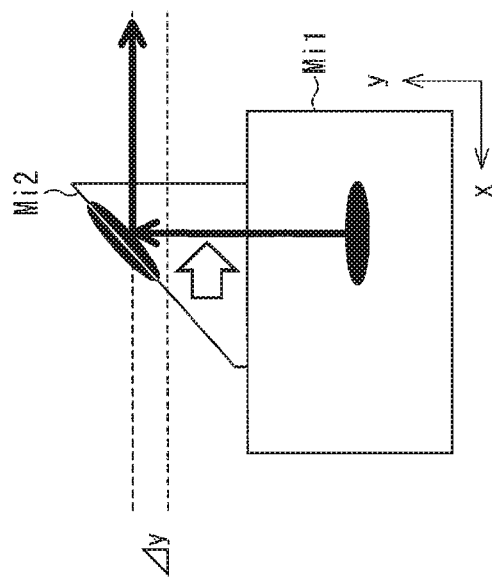

(a) of FIG. 9 is a front view illustrating, as an example, a state of the double mirror prior to a second-mirror sliding step in the flow chart shown in FIG. 5. (b) of FIG. 9 is a front view illustrating, as an example, a state of the double mirror after the second-mirror sliding step.

Figure 10:
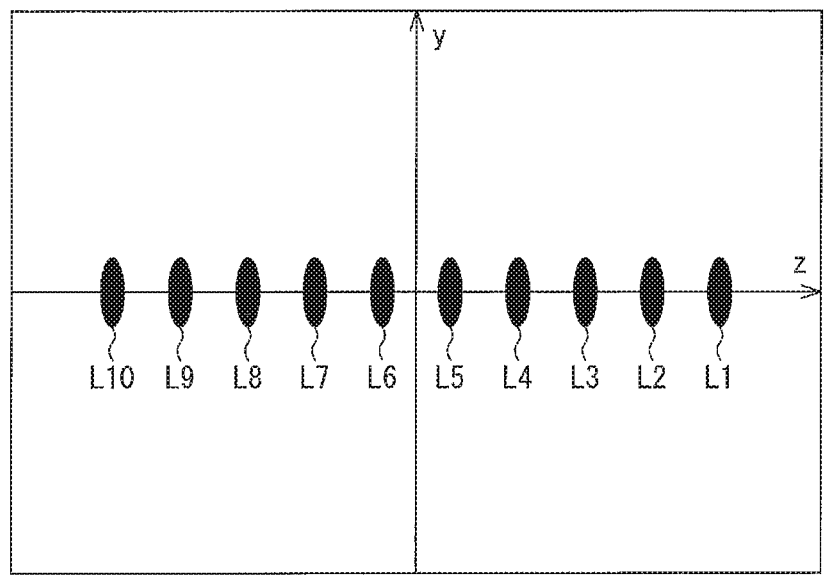

FIG. 10 is a view illustrating positions of output beams that serve as adjustment targets at the time when the adjustment method shown in FIG. 5 is carried out.

Figure 1:
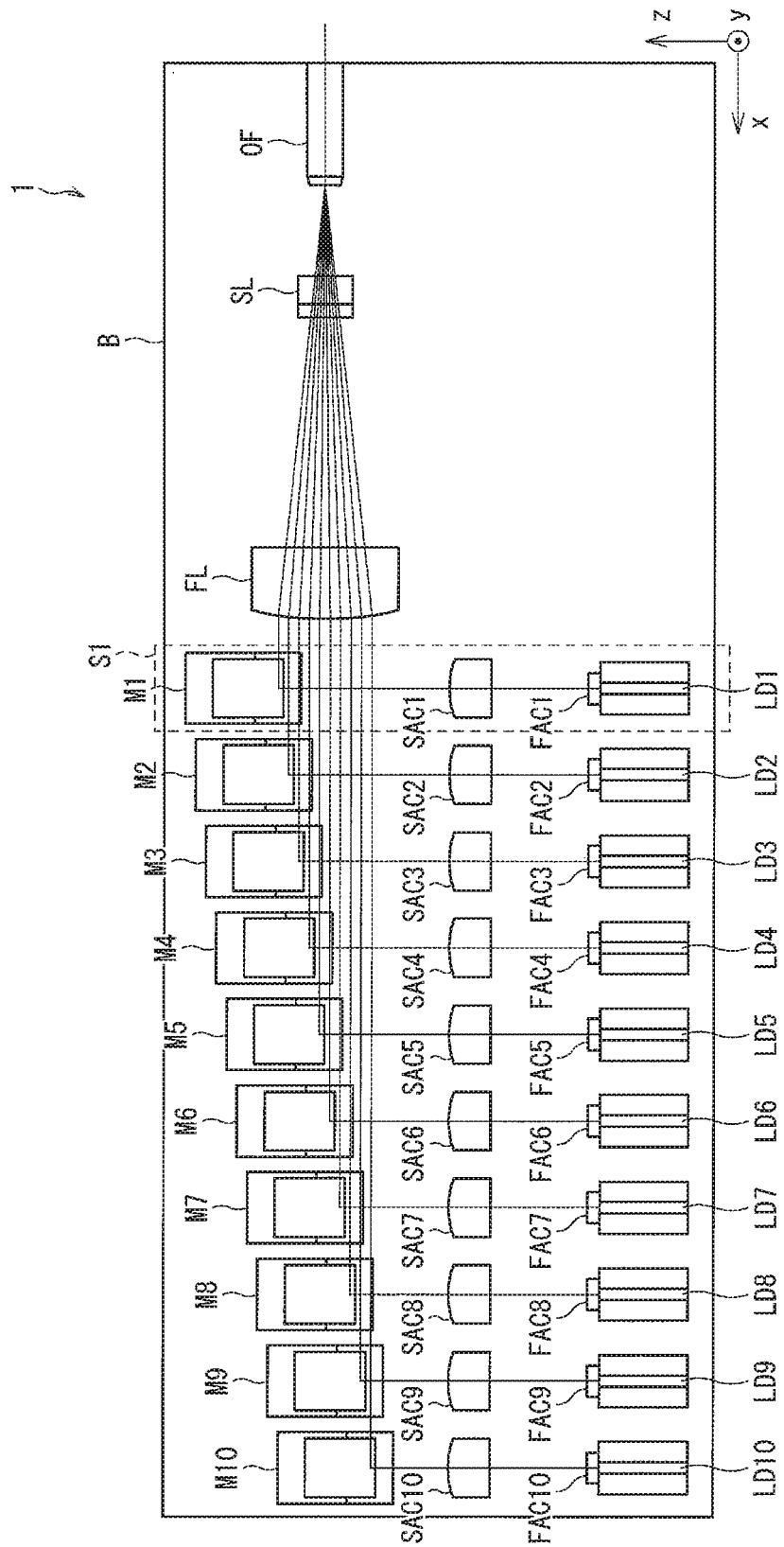
FIG. 1 is a top view illustrating a configuration of an LD module according to one embodiment of the present invention.
Figure 11:
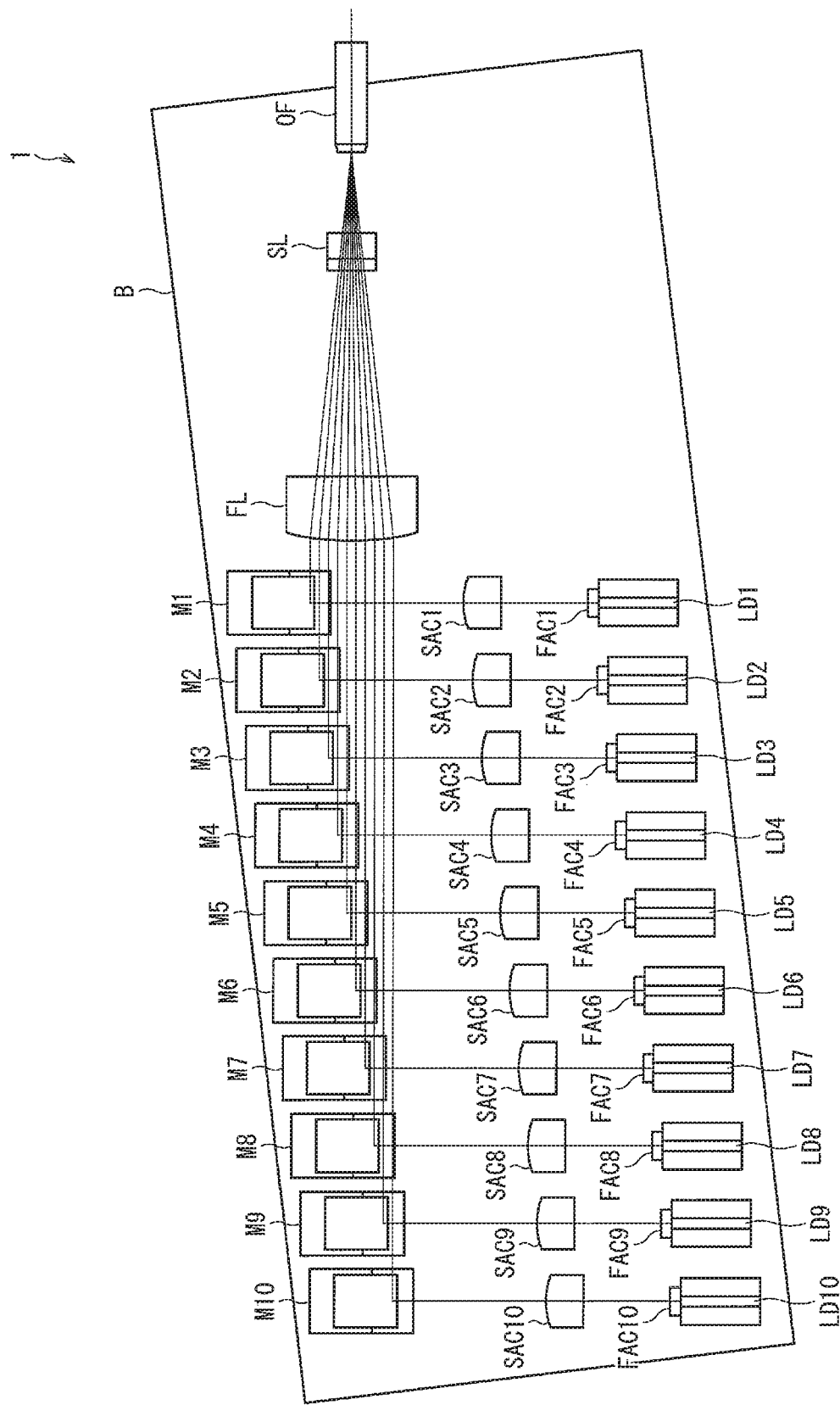

FIG. 11 is a top view illustrating a first modified example of the LD module illustrated in FIG. 1.

Figure 12:
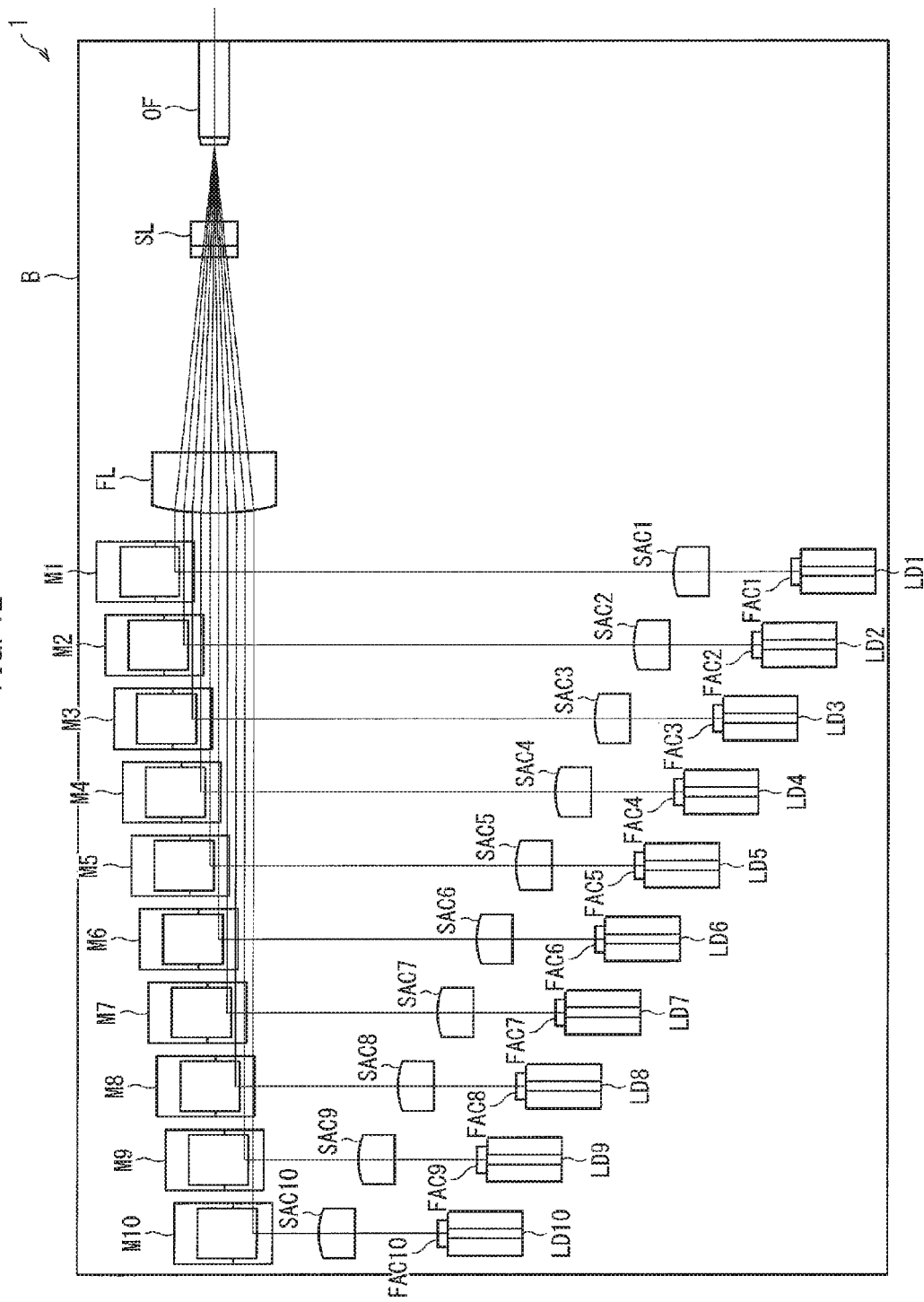

FIG. 12 is a top view illustrating a second modified example of the LD module illustrated in FIG. 1.

Figure 13:
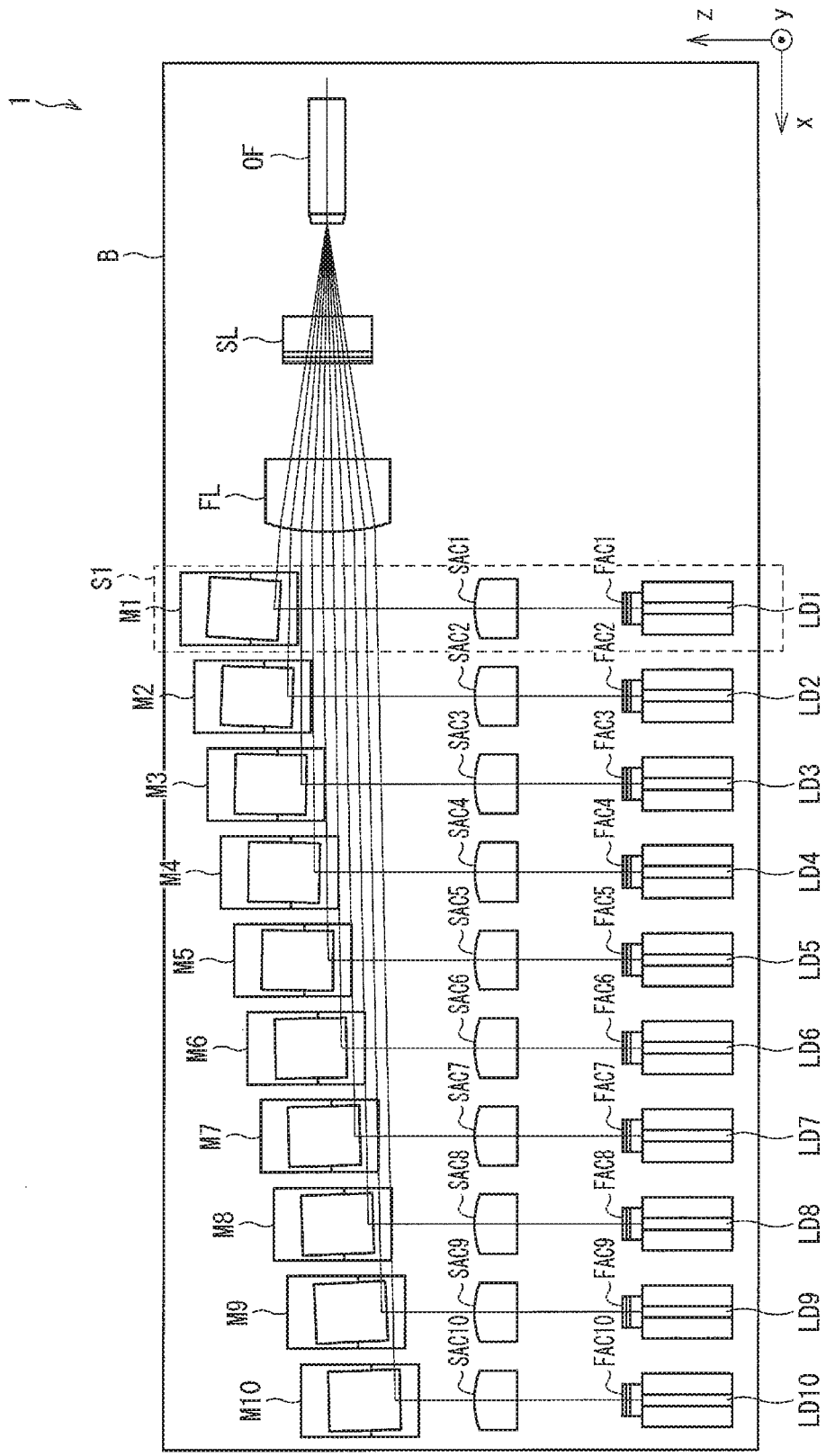

FIG. 13 is a top view illustrating a third modified example of the LD module illustrated in FIG. 1.

Figure 14:
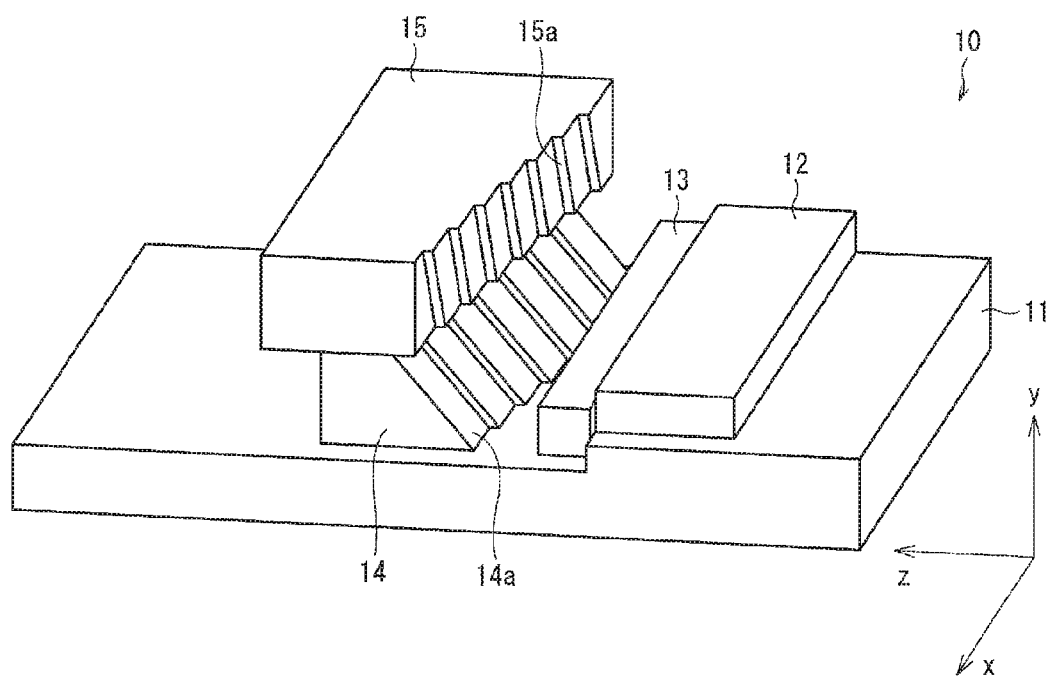

FIG. 14 is a perspective view illustrating a configuration of a conventional micro-optical device.

DESCRIPTION OF EMBODIMENTS

The following discusses an LD module according to one embodiment of the present invention, with reference to drawings.

[Configuration of LD Module]

The following discusses a configuration of an LD module 1 according to the present embodiment, with reference to FIG. 1. FIG. 1 is a top view illustrating the configuration of the LD module 1.

The LD module 1 is a module for coupling laser beams emitted from N LD chips LD1 to LD 10 (N=10 in the present embodiment) to an optical fiber OF. Note that in the present embodiment, the number N of the LD chips provided in the LD module 1 is 10, but in the present invention, the number is not limited to 10. In other words, the number N of LD chips provided in the LD module 1 can be any integer of two or more.

As illustrated in FIG. 1, the LD module 1 includes, in addition to the N LD chips LD1 to LD10, N F-axis collimating lenses FAC1 to FAC10, N S-axis collimating lenses SAC1 to SAC10, N double mirrors M1 to M10, a base plate B, an F-axis light collecting lens FL, and an S-axis light collecting lens SL. All of the LD chips LD1 to L10, the F-axis collimating lenses FAC1 to FAC10, the S-axis collimating lenses SAC1 to SAC10, the double mirrors M1 to M10, the F-axis light collecting lens FL, and the S-axis light collecting lens SL are mounted on the base plate B directly or via a mount (not illustrated).

In the LD module 1, the base plate B, the F-axis collimating lenses FAC1 to FAC10, the S-axis collimating lenses SAC1 to SAC10, and the double mirrors M1 to M10 constitute a light-guiding device corresponding to the conventional micro-optical device 10 (see FIG. 14). This light-guiding device, like the conventional micro-optical device 10, functions to convert an input beam bundle made of laser beams (hereinafter, also referred to as "input beams") that are emitted from the LD chips LD1 to LD10 and propagate in a z-axis positive direction, to an output beam bundle made of laser beams (hereinafter, also referred to as "output beams") that propagate in an x-axis negative direction.

In a light path of this output beam bundle, the F-axis light collecting lens FL and the S-axis light collecting lens SL are provided. The F-axis light collecting lens FL refracts the output beams constituting the output beam bundle so that intervals of the output beams become the smallest at an incident edge surface of the optical fiber OF (preferably, 0). Further, the S-axis light collecting lens SL converges the output beams constituting the output beam bundle so that a beam diameter in a y-axis direction becomes minimum (preferably, 0) at the incident edge surface of the optical fiber OF.

As illustrated in FIG. 1, the LD module 1 includes an optical system, as a unit, that includes an LD chip LDi, an F-axis collimating lens FACi, an S-axis collimating lens SACi, and a double mirror Mi. FIG. 1 illustrates, as an example, a unit optical system S1 which includes the LD chip LD1, the F-axis collimating lens FAC1, the S-axis collimating lens SAC1, and the double mirror M1.

[Configuration of Unit Optical System]

Figure 2:
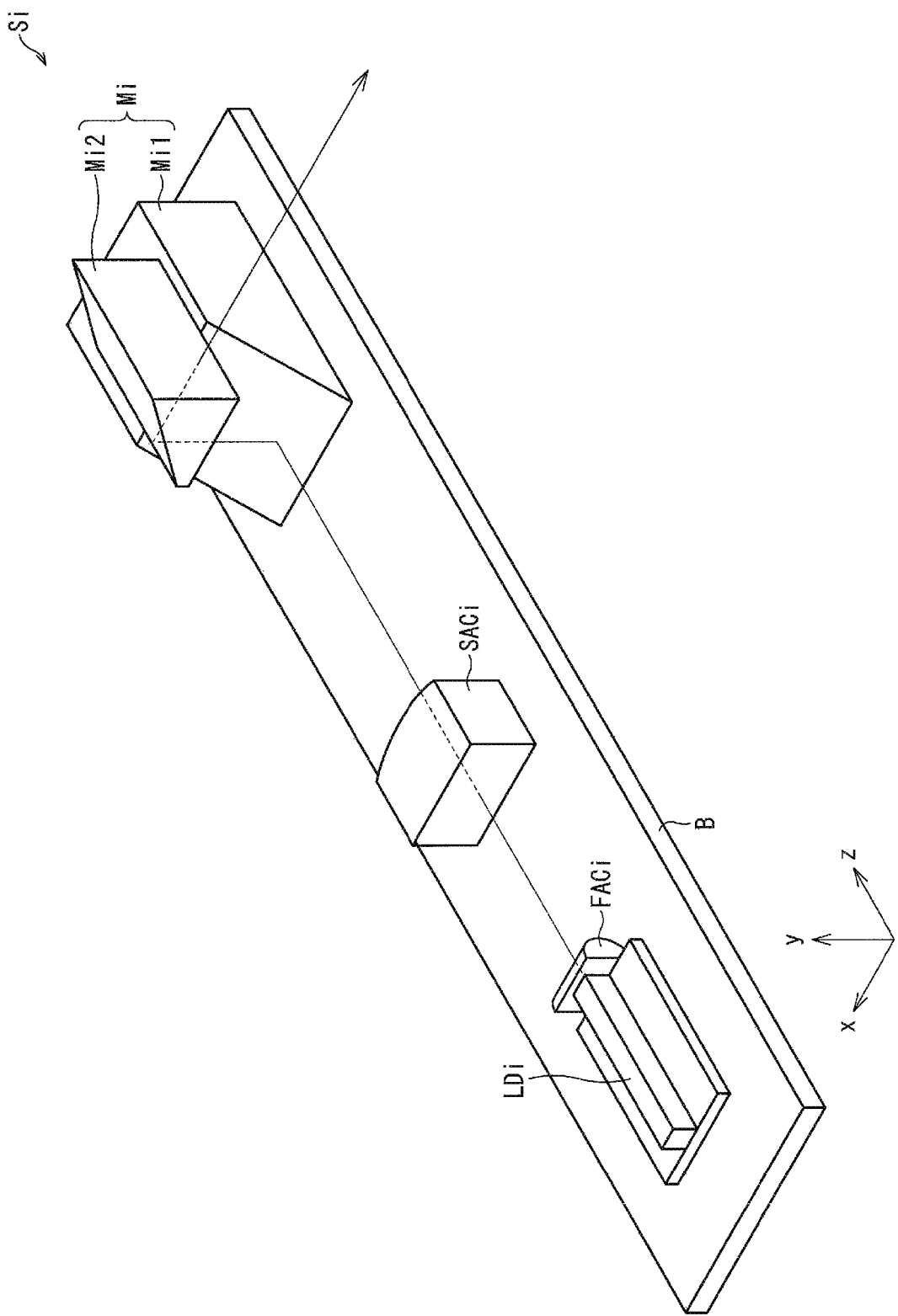
FIG. 2 is a perspective view illustrating a configuration of a unit optical system provided in the LD module illustrated in FIG. 1.

The following discusses a configuration of a unit optical system Si provided in the LD module 1, with reference to FIG. 2. FIG. 2 is a perspective view illustrating a configuration of the unit optical system Si. As illustrated in FIG. 2, the unit optical system Si includes an LD chip LDi, an F-axis collimating lens FACi, an S-axis collimating lens SACi, and a double mirror Mi.

The LD chip LDi is mounted on the base plate B so that an active layer becomes parallel to a zx plane and an emission edge surface faces in the z-axis positive direction. Accordingly, a laser beam emitted from this LD chip LDi has a propagation direction that is the z-axis positive direction, an F axis that is parallel to a y axis, and an S axis that is parallel to an x axis.

Note that the N LD chips LD1 to LD10 are aligned along the x axis, as illustrated in FIG. 1. Therefore, optical axes of the laser beams emitted in the z-axis positive direction from the LD chips LDi are aligned in parallel to one another along the x axis in a first plane that is parallel to the zx plane.

In a light path of the laser beam emitted from the LD chip LDi, the F-axis collimating lens FACi and the S-axis collimating lens SACi are provided. The F-axis collimating lens FACi is a lens for reducing, by collimation, a divergence of the laser beam emitted from the LD chip LDi in an F-axis direction. Meanwhile, the S-axis collimating lens SACi is a lens for reducing, by collimation, a divergence of the laser beam emitted from the LD chip LDi in an S-axis direction. The laser beam having transmitted the F-axis collimating lens FACi and the S-axis collimating lens SACi becomes a collimated beam whose propagation direction is converged in the z-axis positive direction. Note that in a case where the divergence of the laser beam emitted from the LD chip LDi in the S-axis direction is sufficiently small, the S-axis collimating lens SACi can be omitted.

In the light path of the laser beam emitted from the LD chip LDi, the double mirror Mi is further provided. The double mirror Mi is made of an i-th mirror Mi1 mounted on the base plate B and a second mirror Mi2 mounted on the first mirror Mi1. The first mirror Mi1 reflects the laser beam emitted from the LD chip LDi, and changes the propagation direction of the laser beam from the z-axis positive direction to a y-axis positive direction. The first mirror Mi1 is also called a "flip-up mirror". Further, the second mirror Mi2 reflects the laser beam that has been reflected by the first mirror Mi1 so that the propagation direction of the laser beam is changed from the y-axis positive direction to the x-axis negative direction. The second mirror Mi2 is also called a "folding mirror".

Note that as illustrated in FIG. 1, a double mirror Mi+1 that reflects a laser beam emitted from an (i+1)th LD element Di+1 (as counted in a direction from the x-axis negative side to the x-axis positive side) is provided on a z-axis negative direction side of a double mirror Mi that reflects a laser beam emitted from an i-th LD element Di (as counted in the direction from the x-axis positive side to the x-axis negative side). On this account, optical axes of the laser beams reflected by these double mirrors Mi are aligned along a z axis in a second plane that is parallel to the zx plane. This second plain is at a position that is on a y-axis positive direction side of the first plane as described above.

[Configuration of Double Mirror]

Figure 3:
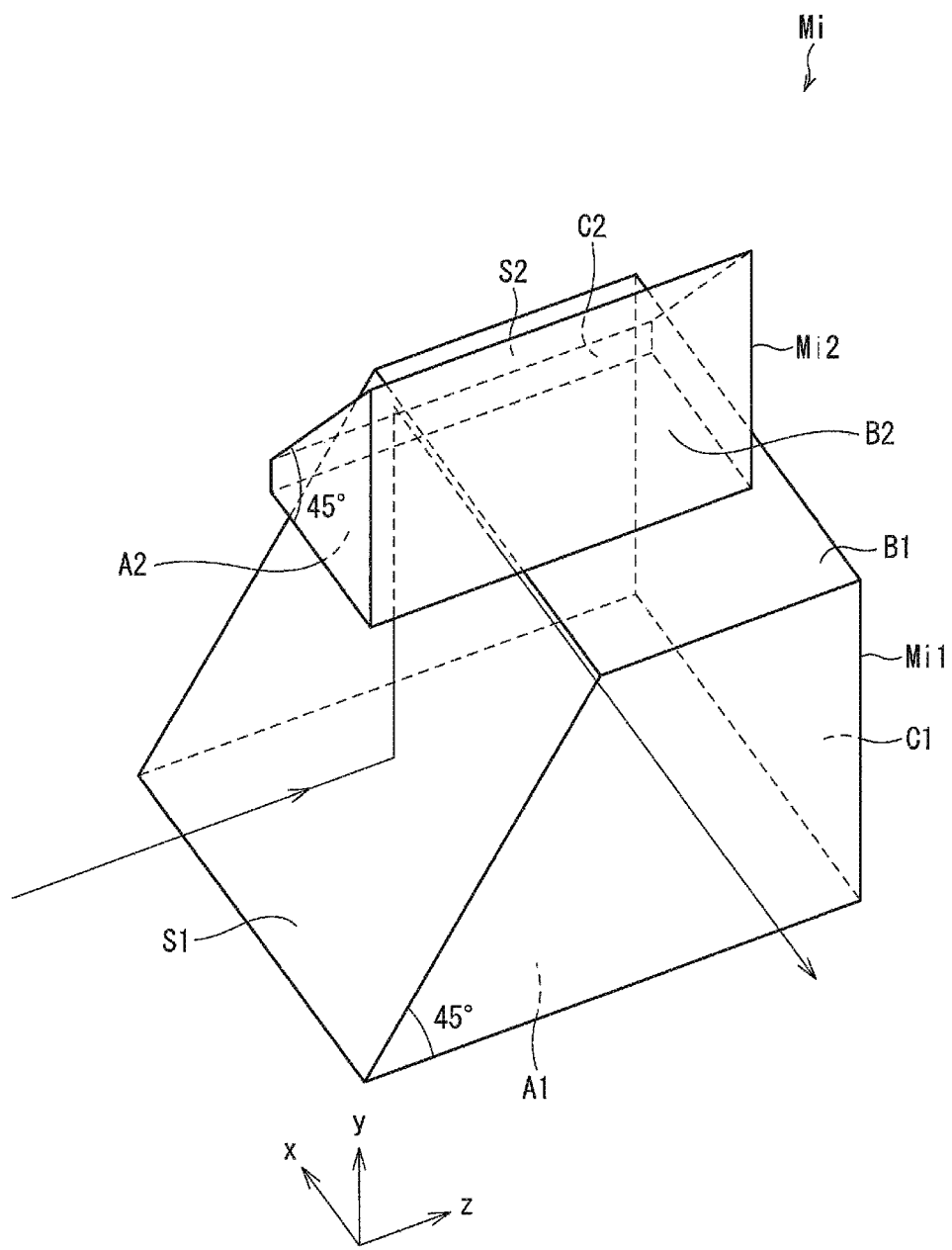
FIG. 3 is a perspective view illustrating a configuration of a double mirror provided in the LD module illustrated in FIG. 1.

The following discusses a configuration of the double mirror Mi provided in the LD module 1, with reference to FIG. 3. FIG. 3 is a perspective view illustrating the configuration of the double mirror Mi. As illustrated in FIG. 3, the double mirror Mi is made of a first mirror Mi1 and a second mirror Mi2.

As illustrated in FIG. 3, the first mirror Mi1 is constituted by a quadrangular prism having a first side surface A1, a second side surface S1, a third side surface B1, and a fourth side surface C1. The second side surface S1 intersects with the first side surface A1 so as to make an angle of 45°. The third side surface B1 intersects with the second side surface S1 so as to make an angle of 135°. The fourth side surface C1 intersects with the third side surface B1 so as to make an angle of 90°. A dielectric multilayer film, which functions as a reflective film that reflects light entering from an outside of the prism, is formed on the second side surface S1. Accordingly, reflection on the second side surface S1 occurs outside the prism (the first mirror Mi1). Note that the second side surface S1 is hereinafter also referred to as "reflective surface S1".

The first mirror Mi1 is mounted on the base plate B so that the first side surface A1 abuts a top surface of the base plate B (see FIG. 2). As a result, a normal vector of the reflective surface S1 of the first mirror Mi1 (an outward normal vector pointing toward outside the first mirror Mi1 from the reflective surface S1) and a normal vector of the top surface (zx plane) of the base plate B (an outward normal vector pointing toward outside the base plate B from the top surface of the base plate B) makes an angle of 45°. Further, an orientation of the first mirror Mi1 is determined so that a normal of the reflective surface S1 becomes parallel to a yz plane. As a result, the reflective surface S1 of the first mirror Mi1 reflects, into the y-axis positive direction, a laser beam that has entered from the z-axis negative direction. The laser beam reflected into the y-axis positive direction by the reflective surface S1 enters the second mirror Mi2 mounted on the first mirror Mi1.

As illustrated in FIG. 3, the second mirror Mi2 is constituted by a quadrangular prism including a first side surface A2, a second side surface B2, a third side surface S2, and a fourth side surface C2. The second side surface B2 intersects with the first side surface A2 so as to make an angle of 90°. The third side surface S2 intersects with the second side surface B2 so as to make an angle of 45° (i.e., the third side surface S2 intersects with the first side surface A2 so as to make an angle of 45°). The fourth side surface C2 intersects with the third side surface S2 so as to make an angle of 135°. Anti reflective (AR) coating (also referred to as "non-reflective coating") is applied to the first side surface A2 and the second side surface B3. This causes light that has entered inside the prism via the first side surface A2 to be totally reflected by the third side surface S2, and the light then exits to the outside of the prism via the second side surface B2. That is, light reflected by the third side surface S2 is totally reflected inside the prism (the second mirror Mi2). Note that the third side surface S2 is hereinafter also referred to as "reflective surface S2".

The second mirror Mi2 is provided such that (i) a part of the first side surface A2 abuts the third side surface B1 of the first mirror Mi1 and (ii) a remaining part of the first side surface A2 faces the reflective surface S1 of the first mirror Mi1. As a result, a normal vector of the reflective surface S2 of the second mirror Mi2 (an inward normal vector pointing toward inside the second mirror Mi2 from the reflective surface S2) and the normal vector of the top surface (zx plane) of the base plate B (an outward normal vector pointing toward outside the base plate B from the top surface of the base plate B) makes an angle of 135°. Accordingly, a laser beam that has been reflected into the y axis positive direction by the reflective surface S1 of the first mirror Mi1 enters inside the second mirror Mi2 via the first side surface A2 of the second mirror Mi2. Further, an orientation of the second mirror Mi2 is determined so that a normal of the reflective surface S2 becomes parallel to an xy plane. As a result, the reflective surface S2 of the second mirror Mi2 reflects, into the x-axis negative direction, a laser beam that has propagated in the y axis positive direction inside the second mirror Mi2. The laser beam that has been reflected into the x axis negative direction by the reflective surface S2 exits to an outside of the second mirror Mi2 via the second side surface B2.

The LD module 1 allows a propagation direction of an output beam to coincide with the x-axis negative direction, by adjusting the orientations of the first mirror Mi1 and the second mirror Mi2 that constitute each double mirror Mi. This is because minute rotation of the first mirror Mi1 around the y axis as a rotation axis causes minute rotation of the propagation direction of the output beam around the z axis as a rotation axis and minute rotation of the second mirror Mi2 around the y axis as a rotation axis causes minute rotation of the propagation direction of the output beam around the y axis as a rotation axis.

Further, in the LD module 1, optical axes of output beams can be aligned at equal intervals within a plane parallel to the xz plane, by adjusting positions of the first mirror Mi1 and the second mirror Mi2 that constitute each double mirror Mi. This is for the following reason: when the first mirror Mi1 is translated in the z-axis positive direction or in the z-axis negative direction, the optical axes of the output beams are translated in the z-axis positive direction or in the z-axis negative direction; and when the second mirror Mi2 is translated in the x-axis positive direction or in the x-axis negative direction, the optical axes of the output beams are translated in the y-axis positive direction or in the y-axis negative direction.

Note that although the present embodiment has discussed a configuration in which, in each double mirror Mi, the normal vector of the reflective surface S1 of the first mirror Mi1 and the normal vector of the top surface of the base plate B make an angle of 45°, the present invention is not limited to the above configuration. That is, the normal vector of the reflective surface S1 of the first mirror Mi1 and the normal vector of the top surface of the base plate B can make an angle of 44° or 46°. That is, the normal vector of the reflective surface S1 of the first mirror Mi1 and the normal vector of the top surface of the base plate B only need to make an angle of substantially 45°. Similarly, although the present embodiment has discussed a configuration in which, in each double mirror Mi, the normal vector of the reflective surface S2 of the second mirror Mi2 and the normal vector of the top surface of the base plate B make an angle of 135°, the present invention is not limited to the above configuration. That is, the normal vector of the reflective surface S2 of the second mirror Mi2 and the normal vector of the top surface of the base plate B can make an angle of 134° or 136°. That is, the normal vector of the reflective surface S2 of the second mirror Mi2 and the normal vector of the top surface of the base plate B only need to be substantially 135°. Even in such a case, propagation directions of the output beams constituting the output beam bundle can be adjusted into a desired direction, by adjusting the orientations of the first mirror Mi1 and the second mirror Mi2 that constitute each double mirror Mi.

The present embodiment has discussed a configuration in which the LD chip LDi is provided so that optical axes of the laser beams emitted from the LD chip LDi are parallel to the z axis. Note, however, that the present invention is not limited to the above configuration. That is, the LD chip LDi can be provided so that optical axes of the laser beams emitted from the LD chip LDi each have a positive elevation angle or a negative elevation angle. Even in such a case, propagation directions of the output beams constituting the output beam bundle can be adjusted into a desired direction, by adjusting the orientations of the first mirror Mi1 and the second mirror Mi2 that constitute each double mirror Mi.

Note that in the present embodiment, a first aim of such adjustment is to make propagation directions of the output beams constituting the output beam bundle coincide with the x-axis negative direction. However, the present invention is not limited to this. In other words, it is sufficient if it is possible to make the propagation directions of the output beams constituting the output beam coincide with a specific direction and this specific direction is not limited to the x-axis negative direction. For example, in a case where the optical fiber OF is provided so as to be inclined so that a central axis of the optical fiber OF has a positive elevation angle or a negative elevation angle, an aim of the arrangement only needs to be to cause the propagation directions of the output beams to be parallel to the central axis of the optical fiber OF.

Further, in the present embodiment, a second aim of such adjustment is to align optical axes of the output beams constituting the output beam bundle at equal intervals in a plane parallel to the zx plane. However, the present invention is not limited to this. In other words, it is sufficient if it is possible to align the optical axes of the output beams constituting the output beam bundle at equal intervals in a specific plane and this specific plane is not limited to the plane parallel to the zx plane.

[Remarks Regarding Second Mirror]

As described above, according to the present embodiment, a quadrangular prism is used as the second mirror Mi2. A prism having such a shape can be integrally formed by use of a transparent body such as quartz glass. This makes it possible to produce, at a low cost, a second mirror Mi2 having a small shape tolerance. Further, the second mirror Mi2 is a mirror that causes total reflection to occur inside the prism. This eliminates the need to apply high reflective coating to a surface of the prism. Also from this viewpoint, the second mirror Mi2 can be produced at a low cost.

Even in consideration of a cost for applying non-reflective coating to an incident surface from which light enters and an exit surface from which light exits, it is possible to produce, at a lower cost, a mirror causing total reflection inside the prism than a mirror causing total reflection outside the prism. This is because the high reflective coating for causing reflection to occur outside the prism is a dielectric multilayer film having a larger number of layers than that of the non-reflective coating, and therefore, a higher cost is required for applying the high reflective coating as compared with the non-reflective coating.

The present embodiment employs a configuration in which the second mirror Mi2 is mounted on the first mirror Mi1 so that a center of gravity of the second mirror Mi2 is provided on the third side surface B1 of the first mirror Mi1. Accordingly, no torque around the x axis or the z axis as a rotation axis is applied to the second mirror Mi2. This makes it possible to stabilize alignment and fixation of the second mirror Mi2, and this allows the second mirror Mi2 to have a smaller positional tolerance.

[Method of Adjusting Orientations and Positions of Mirrors]

Figure 4:
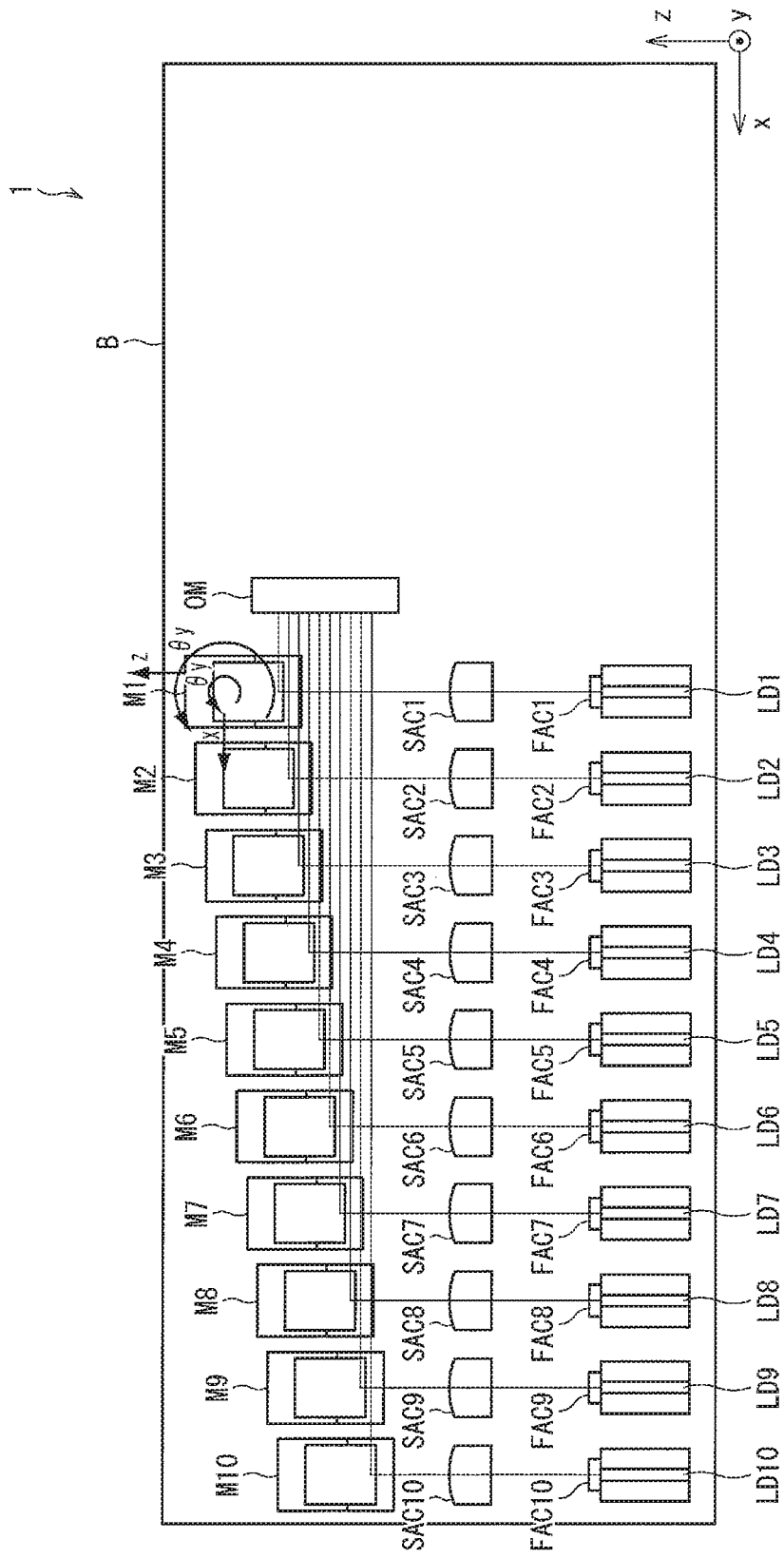
FIG. 4 is a top view illustrating a configuration of an LD module in a case where an adjustment method shown in FIG. 5 is carried out.

The following discusses a method of adjusting an orientation and a position of each of the first mirror Mi1 and the second mirror Mi2, with reference to FIGS. 4 to 10. FIG. 4 is a top view illustrating a configuration of the LD module 1 in a case where this adjustment method is carried out. FIG. 5 is a flow chart illustrating a flow of the adjustment method. FIGS. 6 to 9 are views illustrating, respectively, steps of the adjustment method. FIG. 10 is a view illustrating positions of output beams that serve as adjustment targets in the adjustment method.

The present adjustment method is carried out by use of an optical monitor device OM, as illustrated in FIG. 4. The optical monitor device OM is a device for detecting orientations and positions of incident laser beams. This optical monitor device OM is provided in the light path of the output beam bundle at the time when the present adjustment method is carried out. Further, the present adjustment method is carried out in a state where the bottom surface of the first mirror Mi1, to which bottom surface an adhesive is applied, is mounted on the base plate B, and the bottom surface of the second mirror Mi2, to which bottom surface an adhesive is applied, is mounted on the first mirror Mi1. These adhesives are cured by UV light or the like after the present adjustment method is carried out.

As illustrated in FIG. 5, the present adjustment method is carried out by repeating for each double mirror Mi a first-mirror rotating step T1, a second-mirror rotating step T2, a first-mirror sliding step T3, and a second-mirror sliding step T4.

The first-mirror rotating step T1 is a step in which a propagation direction of an output beam is minutely rotated around the z axis as a rotation axis by causing minute rotation of the first mirror Mi1 around the y axis as a rotation axis. More specifically, in this step T1, the first mirror Mi1 is minutely rotated (rotation around the y axis as a rotation axis) by use of a rotation stage so that an inclination (an inclination caused by the rotation around the z axis as a rotation axis) of the output beam which inclination is detected by the optical monitor device OM becomes the smallest (preferably, 0).

(a) of FIG. 6 is a top view (upper part) and a front view (lower part) each illustrating, as an example, a state of the double mirror Mi prior to the first-mirror rotating step T1. (b) of FIG. 6 is a top view (upper part) and a front view (lower part) each illustrating, as an example, a state of the double mirror Mi after the first-mirror rotating step T1. As illustrated in the lower part of (a) of FIG. 6, in a case where the propagation direction of the output beam has been minutely rotated by $\Delta\theta z$ from an x-axis direction around the z axis as a rotation axis, the first mirror Mi1 is minutely rotated around the y axis as a rotation axis as illustrated in the upper part of (a) of FIG. 6. This makes the propagation direction of the output beam coincide with the x-axis negative direction as illustrated in the lower part of (b) of FIG. 6.

The second-mirror rotating step T2 is a step in which the propagation direction of the output beam is minutely rotated around the y axis as a rotation axis by causing minute rotation of the second mirror Mi2 around the y axis as a rotation axis. More specifically, in this step T2, the first mirror Mi2 is minutely rotated (rotation around the y axis as a rotation axis) by use of a rotation stage so that an inclination (an inclination caused by the rotation around the y axis as a rotation axis) of the output beam which inclination is detected by the optical monitor device OM becomes the smallest (preferably, 0).

(a) of FIG. 7 is a top view (upper part) and a side view (lower part) each illustrating, as an example, a state of the double mirror Mi prior to the second-mirror rotating step T2. (b) of FIG. 7 is a top view (upper part) and a side view (lower part) each illustrating, as an example, a state of the double mirror Mi after the second-mirror rotating step T2. As illustrated in the upper part of (a) of FIG. 7, in a case where the propagation direction of the output beam has been minutely rotated by $\Delta\theta y$ from the x-axis direction around the y axis as a rotation axis, the second mirror Mi2 is minutely rotated around the y axis as a rotation axis, as illustrated in the upper part of (a) of FIG. 7. This makes the propagation direction of the output beam coincide with the x-axis negative direction, as illustrated in the upper part of (b) of FIG. 7.

The first aim of the adjustment is to make propagation directions of respective output beams constituting an output beam bundle coincide with the x-axis negative direction, and this first aim of the adjustment can be achieved by carrying out the first-mirror rotating step T1 and the second-mirror rotating step T2.

The first-mirror sliding step T3 is a step in which an optical axis of the output beam is translated in parallel to the z axis, by translating the first mirror Mi1 in parallel to the z axis. More specifically, this step T3 is a step in which the first mirror Mi1 is translated in parallel to the z axis by use of a position controlling stage so that a z-coordinate of the output beam which is detected by the optical monitor device OM becomes a predetermined adjustment target value.

(a) of FIG. 8 is a side view illustrating, as an example, a state of the double mirror Mi prior to the first-mirror sliding step T3. (b) of FIG. 8 is a side view illustrating, as an example, a state of the double mirror Mi after the first-mirror sliding step T3. As illustrated in (a) of FIG. 8, in a case where the optical axis of the output beam has been shifted by $\Delta z$ in the z-axis positive direction, the first mirror Mi1 is translated in the z-axis negative direction. This eliminates such a shift of the optical axis of the output beam in the z-axis direction, as illustrated in (b) of FIG. 8.

The second-mirror sliding step T4 is a step in which the optical axis of the output beam is translated in parallel to the y axis, by translating the second mirror Mi2 in parallel to the x axis. More specifically, this step T4 is a step in which the second mirror Mi2 is translated in parallel to the x axis by use of a position controlling stage so that a y-coordinate of the output beam detected by the optical monitor device OM becomes a predetermined adjustment target value.

(a) of FIG. 9 is a front view illustrating, as an example, a state of the double mirror Mi prior to the second-mirror sliding step T4. (b) of FIG. 9 is a front view illustrating, as an example, a state of the double mirror Mi after the second-mirror sliding step T4. As illustrated in (a) of FIG. 9, in a case where an optical axis of an output beam has been shifted by $\Delta y$ in the y-axis positive direction, the second mirror Mi2 is translated in the x-axis positive direction. This eliminates such a shift of the optical axis of the output beam in the y-axis direction, as illustrated in (b) of FIG. 9.

The second aim of the adjustment is to align optical axes of the respective output beams constituting the output beam bundle at equal intervals in a plane that is parallel to the zx plane, and this second aim of the adjustment can be achieved by carrying out the first-mirror sliding step T3 and the second-mirror sliding step T4.

In a case where the second aim of the adjustment is to align, at equal intervals, the optical axes of the respective output beams constituting the output beam bundle within a plane that is parallel to the zx plane, the adjustment target values that are to be referred to in the first-mirror sliding step T3 and the second-mirror sliding step T4 should be determined as illustrated in FIG. 10. That is, the adjustment target values should be determined so that beam spots Li of the respective output beams are aligned at equal intervals on the z axis on a light-receiving surface of the optical monitor device OM.

Note that, as illustrated in FIG. 5, the first-mirror sliding step T3 and the second-mirror sliding step T4 are preferably carried out after the propagation directions of the respective output beams constituting the output beam bundle are made parallel to one another by carrying out the first-mirror rotating step T1 and the second-mirror rotating step T2. However, the order in which the first-mirror rotating step T1 and the second-mirror rotating step T2 are carried out and the order in which the first-mirror sliding step T3 and the second-mirror sliding step T4 are carried out are not limited to those shown in FIG. 5. In other words, it is possible to employ a configuration in which the first-mirror rotating step T1 is carried out after the second-mirror rotating step T2 is carried out and/or a configuration in which the first-mirror sliding step T3 is carried out after the second-mirror sliding step T4 is carried out.

Further, in a case where an adhesive is used for fixing the first mirror Mi1 to the base plate B and for fixing the second mirror Mi2 to the first mirror Mi1, it is preferable to fix the first mirror Mi1 and the second mirror Mi2 as follows. That is, after the adhesive is applied between the bottom surface of the first mirror Mi1 and the top surface of the base plate B and between the bottom surface of the second mirror Mi2 and the top surface of the first mirror Mi1, the first-mirror rotating step T1, the second-mirror rotating step T2, the first-mirror sliding step T3, and the second-mirror sliding step T4 are carried out. Note, however, that in a period in which these steps T1 to T4 are carried out and in a period from the end of these steps through the completion of curing of the adhesive, the top surface and the bottom surface of the first mirror Mi1, the top surface of the base plate B, and the bottom surface of the second mirror Mi2 are kept in a state in which the bottom surface of the first mirror Mi1 and the top surface of the base plate B are parallel to each other and the bottom surface of the second mirror Mi2 and the top surface of the first mirror Mi1 are parallel to each other. This makes it possible to uniformize a thickness of an adhesive layer formed between the bottom surface of the first mirror Mi1 and the top surface of the base plate B and a thickness of an adhesive layer formed between the bottom surface of the second mirror Mi2 and the top surface of the first mirror Mi1.

If the thickness of the adhesive layer formed between the top surface of the base plate B and the bottom surface of the first mirror Mi1 is uniform, an amount of expansion or shrinkage becomes equal at any position even in a case where the adhesive layer expands or shrinks. Accordingly, even in a case where the adhesive layer expands or shrinks, only parallel shift of the first mirror Mi1 occurs in a direction that is orthogonal to the top surface of the base plate B (a thickness direction of the adhesive layer), and the top surface of the base plate B and the bottom surface of the first mirror Mi1 stay parallel to each other. Similarly, if the thickness of the adhesive layer formed between the top surface of the first mirror Mi1 and the bottom surface of the second mirror Mi2 is uniform, only parallel shift of the second mirror Mi2 occurs in a direction that is orthogonal to the top surface of the first mirror Mi1, and the top surface of the first mirror Mi1 and the bottom surface of the second mirror Mi2 stay parallel to each other even in a case where the adhesive layer expands or shrinks. Accordingly, if the thickness of each of these adhesive layers is uniform, it is possible to avoid the occurrence of, for example, a case where a propagation direction of an output beam inclines or a case where alignment of the optical axes of the output beams is lost even in a case where the adhesive layers shrink or expand. Note that possible shrinkage or expansion of these adhesive layers includes (i) cure shrinkage that may occur when the adhesive is cured and (ii) thermal expansion, thermal shrinkage, or swelling that may occur after the adhesive is cured.

Furthermore, preferably, each of the thickness of the adhesive layer formed between the top surface of the base plate B and the bottom surface of the first mirror Mi1 and the thickness of the adhesive layer formed between the top surface of the first mirror Mi1 and the bottom surface of the second mirror Mi2 is made as small as possible in a range that can ensure a required adhesive force. A smaller thickness of each of these adhesive layers results in a smaller amount of change in thickness that occurs in a case where each of these adhesive layers expands or shrinks. This consequently makes it easily to keep the top surface of the base plate B and the bottom surface of the first mirror Mi1 parallel to each other and also keep the top surface of the first mirror Mi1 and the bottom surface of the second mirror Mi2 parallel to each other. Particularly, it is preferable that each of (a) the thickness of the adhesive layer formed between the top surface of the base plate B and the bottom surface of the first mirror Mi1 and (b) the thickness of the adhesive layer formed between the top surface of the first mirror Mi1 and the bottom surface of the second mirror Mi2 be smaller than a tolerance of the base plate B (more specifically, a tolerance of a thickness of the base plate B) and also be smaller than a dimensional tolerance of the double mirror Mi (more specifically, a tolerance of a thickness of the first mirror Mi1 or a thickness of the second mirror). In this case, an amount of change in thickness that occurs in a case where each of the adhesive layers expands or shrinks becomes also smaller than each of the dimensional tolerance of the double mirror Mi and the dimensional tolerance of the base plate B (in general, the amount of change in thickness of each of the adhesive layers is smaller than the thickness of each of the adhesive layers). Therefore, even in a case where these adhesive layers expand or shrink, a degree of parallelism of the top surface of the base plate B and the bottom surface of the first mirror Mi1 and a degree of parallelism of the top surface of the first mirror Mi1 and the bottom surface of the second mirror Mi2 never become lower than a degree accepted in designing regardless of whether or not the thicknesses of the adhesive layers are uniform.

As described above, in the light-guiding device of the present invention, the double mirror (Mi) is made of (i) the first mirror (Mi1) that is mounted on the top surface of the base plate (B) and (ii) the second mirror (Mi2) that is mounted on the top surface of the first mirror (Mi1) (see FIG. 2). As illustrated in FIG. 3, the first mirror (Mi1) has the reflective surface (S1) that reflects input beams entering the reflective surface (S1), and the second mirror (Mi2) has the reflective surface (S2) that reflects the input beams reflected by the reflective surface (S1). The second mirror (Mi2) is a prism, and the input beams reflected by the reflective surface S2 is totally reflected inside the prism.

This makes it possible to provide a light-guiding device that is capable of adjusting propagation directions of output beams into a predetermined direction even in a case where propagation directions of input beams are inclined non-uniformly or uniformly.

Modified Examples

Note that although the present embodiment has discussed a configuration where the LD chips LD1 to LD10 are provided along the x axis, the present invention is not limited to this configuration.

For example, as illustrated in FIG. 11, the LD chips LD1 to LD10 each may be provided obliquely in a manner such that a light path length from an LD chip LDi to a double mirror Mi becomes constant. In this case, it is possible to reduce a size of the base plate B as illustrated in FIG. 11.

Alternatively, as illustrated in FIG. 12, the LD chips LD1 to LD10 may be provided along an oblique line in a manner such that a light path length from an LD chip LDi to the F-axis light collecting lens FL becomes constant. In this case, beam radii of the laser beams incident on the F-axis light collecting lens FL become the same. Accordingly, the output beam bundle can be converged more precisely.

Alternatively, as illustrated in FIG. 13, it is possible to employ a configuration in which orientations of the first mirror Mi1 and the second mirror Mi2 that constitute each double mirror Mi are adjusted so that extensions of respective optical axes of the output beams constituting the output beam bundle intersect with each other at one point. Employment of such a configuration allows the F-axis light collecting lens FL to have larger curvature as compared with a case where propagation directions of the output beams constituting the output beam bundle are caused to be coincide with the x axis negative direction (see FIG. 1), and this consequently allows the F-axis light collecting lens FL to have smaller aberration.

Note that according to the double mirror Mi of the LD module 1 in accordance with the present embodiment, an input beam entering "from an outside" of the first mirror Mi1 is reflected "to the outside" of the first mirror Mi1 by the first reflective surface S1 of the first mirror Mi1 (see FIG. 3). That is, reflection occurring on the first reflective surface S1 occurs outside of the first mirror Mi1.

This allows an input beam reflected by the first reflective surface S1 of the first mirror Mi1 to enter the second mirror Mi2 without passing through a boundary surface between the first mirror Mi1 and the second mirror Mi2. Accordingly, even in a case where the first mirror Mi1 and the second mirror Mi2 are connected with each other by use of an adhesive, the adhesive does not block a light path.

This eliminates the need to consider various problems caused by interposition, in the light path, of the adhesive which is a resin. That is, even in a case where the adhesive is used for connecting the first mirror Mi1 with the second mirror Mi2, the following problems (1) and (2) do not need to be considered:
(1) Reflection of light by the adhesive or loss of light due to absorption of light by the adhesive; and
(2) Heat generation due to absorption of light by the adhesive, and deterioration or burning of the adhesive or peripheral members due to the heat generation.

According to the double mirror Mi in accordance with the present embodiment, it is possible to use a resin containing a filler as the adhesive for connecting the first mirror Mi1 with the second mirror Mi2. In a case where the resin containing a filler is interposed in the light path, such interposition of the resin normally causes scattering of light and a decrease in coupling efficiency of light.

However, according to the present embodiment, the boundary surface which is a connecting part of the first mirror Mi1 and the second mirror Mi2 is not provided in the light path. Accordingly, no problem arises even in a case where the resin containing a filler is used for connecting the first mirror Mi1 with the second mirror Mi2. Instead, use of the resin containing a filler for connecting the first mirror Mi1 with the second mirror Mi2 brings about an effect of preventing swelling and cure shrinkage of the adhesive at the connecting part of the first mirror Mi1 and the second mirror Mi1.

CONCLUSION

A light-guiding device according to the present embodiment is a light-guiding device that converts an input beam bundle made of a plurality of input beams to an output beam bundle made of a plurality of output beams, including: double mirrors each corresponding to a corresponding one of the input beams, the double mirrors each being separated from the other double mirrors each corresponding to another one of the input beams, the double mirrors respectively corresponding to the input beams each being made of a first mirror that is mounted on a specific flat surface and a second mirror that is mounted on the first mirror, the first mirror having a first reflective surface reflecting a corresponding one of the input beams, the second mirror having a second reflective surface reflecting the corresponding one of the input beams that has been reflected by the first reflective surface, the second mirror being a prism, the corresponding one of the input beams reflected by the second reflective surface being totally reflected inside the prism.

In the above configuration, the first reflective surface for reflecting a corresponding one of the input beams is provided to the first mirror mounted on the specific flat surface. Further, the second reflective surface for reflecting the input beam reflected by the first reflective surface is provided to the second mirror mounted on the first mirror. Accordingly, a propagation direction of each of the output beams can be freely adjusted by rotating each of the first mirror and the second mirror. For example, even in a case where a propagation direction of an input beam is inclined, a propagation direction of a corresponding output beam can be adjusted into a predetermined direction. Furthermore, a position of an optical axis of each of the output beams can also be freely adjusted by sliding each of the first mirror and the second mirror.

Moreover, in the above configuration, the double mirrors each correspond to a corresponding one of the input beams. Further, each of these double mirrors is separated from the other double mirrors each corresponding to another one of the input beams. Accordingly, a propagation direction of each of the output beams can be adjusted independently from propagation directions of the other output beams. This makes it possible to adjust the propagation directions of the output beams into a predetermined direction even in a case where the propagation directions of the input beams vary. In addition, it also becomes possible to adjust a position of an optical axis of each of the output beams independently from positions of optical axes of the other output beams.

In the above configuration, the second mirror is a prism. This allows the second mirror to have a smaller shape tolerance and makes it possible to produce the second mirror at a low cost. Further, in the above configuration, the corresponding one of the input beams reflected by the second reflective surface is totally reflected inside the prism. This eliminates the need to apply high reflective coating to a surface of the second mirror. Also from this viewpoint, the second mirror can be produced at a low cost.

In the light-guiding device according to the present embodiment, preferably, a normal of the first reflective surface and a normal of the specific flat surface make an angle of 45°; and a normal of the second reflective surface and the normal of the specific flat surface make an angle of 135°.

According to the above configuration, a propagation direction of an input beam that propagates in a direction parallel to the specific flat surface can be converted to a direction perpendicular to the specific flat surface by reflection occurring on the first reflective surface, and the propagation direction of the input beam can be further converted to a direction parallel to the specific flat surface by reflection occurring on the second reflective surface.

In the light-guiding device according to the present embodiment, preferably, in each one of the double mirrors respectively corresponding to the input beams, respective orientations of the first mirror and the second mirror are adjusted so that propagation directions of the output beams constituting the output beam bundle coincide with a specific direction.

The above configuration makes it possible to obtain an output beam bundle that can be converged precisely through a convex lens or the like.

In the light-guiding device according to the present embodiment, preferably, in each one of the double mirrors respectively corresponding to the input beams, respective positions of the first mirror and the second mirror are adjusted so that optical axes of the output beams constituting the output beam bundle are aligned at equal intervals within a specific plane.

The above configuration makes it possible to obtain an output beam bundle that can be converged more precisely.

In the light-guiding device according to the present embodiment, preferably, in each one of the double mirrors respectively corresponding to the input beams, respective orientations of the first mirror and the second mirror are adjusted so that extensions of respective optical axes of the output beams constituting the output beam bundle intersect with each other at one point.

The above configuration makes it possible to obtain an output beam bundle that can be converged precisely through a convex lens or the like.

In the light-guiding device according to the present embodiment, preferably, the specific flat surface and a bottom surface of the first mirror are adhered to each other via an adhesive layer formed between the specific flat surface and the bottom surface, the adhesive layer having a uniform thickness; and a top surface of the first mirror and a bottom surface of the second mirror are adhered to each other via an adhesive layer formed between the top surface of the first mirror and the bottom surface of the second mirror, the adhesive layer having a uniform thickness.

The above configuration makes it possible to avoid the occurrence of, for example, a case where a propagation direction of an output beam inclines or a case where alignment of the optical axes of the output beams is lost even in a case where the adhesive layers shrink or expand.

In the light-guiding device according to the present embodiment, preferably, a thickness of an adhesive layer formed between the specific flat surface and a bottom surface of the first mirror and a thickness of an adhesive layer formed between a top surface of the first mirror and a bottom surface of the second mirror each are smaller than a dimensional tolerance of the double mirrors.

According to the above configuration, even in a case where these adhesive layers expand or shrink, a degree of parallelism of the specific flat surface and the bottom surface of the first mirror and a degree of parallelism of the top surface of the first mirror and the bottom surface of the second mirror never become lower than a degree accepted in designing regardless of whether or not the thicknesses of the adhesive layers are uniform.

In the light-guiding device according to the present embodiment, preferably, a center of gravity of the second mirror is provided on a top surface of the first mirror.

The above configuration causes no torque to be applied to the second mirror. This makes it possible to stabilize alignment and fixation of the second mirror, and this allows the second mirror to have a smaller positional tolerance.

The scope of the present invention encompasses a method for producing the light-guiding device.

Further, it becomes possible to produce a light-guiding device generating an output beam bundle that can be converged precisely, by further including the step of adjusting respective orientations of the first mirror and the second mirror of each one of the double mirrors so that propagation directions of the output beams constituting the output beam bundle coincide with a specific direction, the each one of the double mirrors corresponding to a corresponding one of the input beams, or by further including the step of adjusting respective positions of the first mirror and the second mirror of each one of the double mirrors so that respective optical axes of the output beams constituting the output beam bundle are aligned at equal intervals within a specific plane, the each one of the double mirrors corresponding to a corresponding one of the input beams in addition to the step of adjusting respective orientations of the first mirror and the second mirror.

The scope of the present invention also encompasses an LD module including the light-guiding device.

By including the light-guiding device, it becomes possible to provide an LD module capable of realizing a higher output and a higher efficiency.

[Additional Matters]

The present invention is not limited to the description of the embodiments above, but may be altered as appropriate by a skilled person within the scope of the claims. That is, the present invention encompasses an embodiment based on a proper combination of technical means modified as appropriate within the scope of the claims.

INDUSTRIAL APPLICABILITY

The present invention can be suitably applied to an LD module, and in particular, to an LD module that has an LD chip(s) as a light source.

REFERENCE SIGNS LIST

1 LD module
LD1 to LD10 LD chip
FAC1 to FAC10 F-axis collimating lens
SAC1 to SAC10 S-axis collimating lens
M1 to M10 Double mirror
Mi1 First mirror
S1 Reflective surface (first reflective surface)
Mi2 Second mirror
S2 Reflective surface (second reflective surface)
B Base plate
FL F-axis light collecting lens
SL S-axis light collecting lens

The invention claimed is:

1. A light-guiding device that converts an input beam bundle made of a plurality of input beams to an output beam bundle made of a plurality of output beams, comprising:
    double mirrors each corresponding to a corresponding one of the input beams, the double mirrors each being separated from the other double mirrors each corresponding to another one of the input beams,
    the double mirrors respectively corresponding to the input beams each being made of a first mirror that is mounted on a specific flat surface and a second mirror that is mounted on the first mirror,
    the first mirror having a first side surface which abuts the specific flat surface, a second side surface which serves as a first reflective surface reflecting a corresponding one of the input beams, and a third side surface which is parallel to the first side surface,
    the second mirror is a prism having a shape of pillar that has a first side surface and a second side surface, a part of the first side surface of the second mirror abutting the third side surface of the first mirror and a rest of the first side surface of the second mirror facing the second side surface of the first mirror, and the second side surface of the second mirror serving as a second reflective surface reflecting the corresponding one of the input beams that has been reflected by the first reflective surface and entered the second mirror via the first side surface of the second mirror, and
    the corresponding one of the input beams reflected by the second reflective surface being totally reflected inside the prism.

2. The light-guiding device as set forth in claim 1, wherein:
    an outward normal vector of the first reflective surface and a normal vector of the specific flat surface make an angle of substantially 45°; and
    an inward normal vector of the second reflective surface and the normal vector of the specific flat surface make an angle of substantially 135°.

3. The light-guiding device as set forth in claim 1, wherein:
    in each one of the double mirrors respectively corresponding to the input beams, respective orientations of the first mirror and the second mirror are adjusted so that propagation directions of the output beams constituting the output beam bundle coincide with a specific direction.

4. The light-guiding device as set forth in claim 3, wherein:
    in each one of the double mirrors respectively corresponding to the input beams, respective positions of the first mirror and the second mirror are adjusted so that optical axes of the output beams constituting the output beam bundle are aligned at equal intervals within a specific plane.

5. The light-guiding device as set forth in claim 1, wherein:
    in each one of the double mirrors respectively corresponding to the input beams, respective orientations of the first mirror and the second mirror are adjusted so that extensions of respective optical axes of the output beams constituting the output beam bundle intersect with each other at one point.

6. The light-guiding device as set forth in claim 1, wherein:

the specific flat surface and a bottom surface of the first mirror are adhered to each other via an adhesive layer formed between the specific flat surface and the bottom surface, the adhesive layer having a uniform thickness; and a top surface of the first mirror and a bottom surface of the second mirror are adhered to each other via an adhesive layer formed between the top surface of the first mirror and the bottom surface of the second mirror, the adhesive layer having a uniform thickness.

7. The light-guiding device as set forth in claim 1, wherein:
a thickness of an adhesive layer formed between the specific flat surface and a bottom surface of the first mirror and a thickness of an adhesive layer formed between a top surface of the first mirror and a bottom surface of the second mirror each are smaller than a dimensional tolerance of the double mirrors.

8. The light-guiding device as set forth in claim 1, wherein a center of gravity of the second mirror is provided on a top surface of the first mirror.

9. A method for producing the light-guiding device as set forth in claim 1, comprising the step of:
adjusting respective orientations of the first mirror and the second mirror of each one of the double mirrors so that propagation directions of the output beams constituting the output beam bundle coincide with a specific direction, the each one of the double mirrors corresponding to a corresponding one of the input beams.

10. A method for producing the light-guiding device as set forth in claim 9, further comprising the step of:
adjusting respective positions of the first mirror and the second mirror of each one of the double mirrors so that respective optical axes of the output beams constituting the output beam bundle are aligned at equal intervals within a specific plane, the each one of the double mirrors corresponding to a corresponding one of the input beams.

11. A method for producing the light-guiding device as set forth in claim 9, further comprising the step of:
adjusting respective orientations of the first mirror and the second mirror of each one of the double mirrors so that extensions of respective optical axes of the output beams constituting the output beam bundle intersect with each other at one point, the each one of the double mirrors corresponding to a corresponding one of the input beams.

12. An LD module comprising:
a plurality of LD elements; and
a light-guiding device that converts an input beam bundle made of a plurality of laser beams that have respectively been emitted from the plurality of LD elements, to an output beam bundle made of a plurality of output beams,
the light guiding device including double mirrors each corresponding to a corresponding one of the LD elements, the double mirrors each being separated from the other double mirrors each corresponding to another one of the LD elements,
the double mirrors respectively corresponding to the LD elements each being made of a first mirror that is mounted on a specific flat surface and a second mirror that is mounted on the first mirror,
the first mirror having (i) a first side surface which abuts the specific flat surface, (ii) a second side surface which serves as a first reflective surface reflecting a corresponding one of the laser beams, the corresponding one of the laser beams being emitted from a corresponding one of the LD elements, and (iii) a third side surface which is parallel to the first side surface, the second mirror is a prism having a shape of pillar that has a first side surface and a second side surface, a part of the first side surface of the second mirror abutting the third side surface of the first mirror and a rest of the first side surface of the second mirror facing the second side surface of the first mirror, and the second side surface of the second mirror serving as a second reflective surface reflecting the corresponding one of the laser beams that has been reflected by the first reflective surface and entered the second mirror via the first side surface of the second mirror, and the corresponding one of the laser beams reflected by the second reflective surface being totally reflected inside the prism.

13. An LD module as set forth in claim 12, further comprising:
a converging lens that converges the output beam bundle on an incident edge surface of an optical fiber,
wherein in each one of the double mirrors respectively corresponding to the LDs, respective orientations of the first mirror and the second mirror are adjusted so that propagation directions of the output beams constituting the output beam bundle coincide with a specific direction,
wherein in each one of the double mirrors respectively corresponding to the LDs, respective positions of the first mirror and the second mirror are adjusted so that optical axes of the output beams constituting the output beam bundle are aligned at equal intervals within a specific plane.

14. An LD module as set forth in claim 12, further comprising:
a converging lens that converges the output beam bundle on an incident edge surface of an optical fiber,
wherein in each one of the double mirrors respectively corresponding to the LDs, respective orientations of the first mirror and the second mirror are adjusted so that extensions of respective optical axes of the output beams constituting the output beam bundle intersect with each other at one point.

15. The light-guiding device as set forth in claim 1, wherein:
the prism further has (i) a third side surface from which the corresponding one of the input beams that has been reflected by the second reflective surface is emitted and (ii) a fourth side surface which is opposite to the third side surface; and
the second mirror is mounted on the first mirror such that one of bottom surfaces of the second mirror faces a light source of the corresponding one of the input beams which enters the first reflective surface.

16. The LD module as set forth in claim 12, wherein:
the prism further has (i) a third side surface from which the corresponding one of the laser beams that has been reflected by the second reflective surface is emitted and (ii) a fourth side surface which is opposite to the third side surface; and
the second mirror is mounted on the first mirror such that one of bottom surfaces of the second mirror faces a light source of the corresponding one of the laser beams which enters the first reflective surface.

17. The light-guiding device as set forth in claim 1, wherein the rest of the first side surface of the second mirror projects from an edge of the third side surface of the first mirror so as to be exposed and to face the second side surface of the first mirror to serve as a light receiving surface to receive a light reflected from the second side surface of the first mirror.

18. The LD module as set forth in claim 12, wherein the rest of the first side surface of the second mirror projects from an edge of the third side surface of the first mirror so as to be exposed and to face the second side surface of the first mirror to serve as a light receiving surface to receive a light reflected from the second side surface of the first mirror.

* * * * *